(12) United States Patent
El-Kareh et al.

(10) Patent No.: US 7,670,890 B2
(45) Date of Patent: *Mar. 2, 2010

(54) SILICIDE BLOCK ISOLATED JUNCTION FIELD EFFECT TRANSISTOR SOURCE, DRAIN AND GATE

(75) Inventors: Badih El-Kareh, Cedar Park, TX (US); Hiroshi Yasuda, Munich (DE); Scott Gerard Balster, Dallas, TX (US); Philipp Steinmann, Unterschleissheim (DE); Joe R. Trogolo, Plano, TX (US)

(73) Assignees: Texas Instruments Deutschland GmbH, Freising (DE); Texas Instruments Incorporated, Dallas, TX (US)

( * ) Notice: Subject to any disclaimer, the term of this patent is extended or adjusted under 35 U.S.C. 154(b) by 540 days.

This patent is subject to a terminal disclaimer.

(21) Appl. No.: 11/493,229

(22) Filed: Jul. 26, 2006

(65) Prior Publication Data

US 2008/0026515 A1 Jan. 31, 2008

(51) Int. Cl.
*H01L 29/80* (2006.01)
*H01L 21/337* (2006.01)
(52) U.S. Cl. ........................ 438/188; 438/186; 438/196; 257/256; 257/274; 257/E21.421
(58) Field of Classification Search ................. 438/186, 438/188, 196; 257/256, 274, E21.421
See application file for complete search history.

(56) References Cited

U.S. PATENT DOCUMENTS

| | | | |
|---|---|---|---|
| 4,322,738 A | 3/1982 | Bell et al. | |
| 6,238,984 B1 | 5/2001 | Yang | |
| 6,288,424 B1 | 9/2001 | Ludikhuize | |
| 6,339,018 B1 | 1/2002 | Ballantine et al. | |
| 6,468,847 B1 | 10/2002 | Disney | |
| 6,476,449 B1 | 11/2002 | Lin | |
| 6,730,554 B1 | 5/2004 | Baldwin et al. | |
| 2002/0074612 A1* | 6/2002 | Bulucea et al. | 257/402 |
| 2005/0184343 A1* | 8/2005 | Thornton et al. | 257/351 |
| 2008/0014687 A1* | 1/2008 | Vora et al. | 438/186 |

OTHER PUBLICATIONS

U.S. Appl. No. 11/54,412, filed Aug. 15, 2006, Trogolo et al.
Office Action Dated Aug. 28, 2008 for U.S. Appl. No. 11/504,412.

* cited by examiner

*Primary Examiner*—Thao X Le
*Assistant Examiner*—Tanika Warrior
(74) *Attorney, Agent, or Firm*—Warren L. Franz; Wade J. Brady, III; Frederick J. Telecky, Jr.

(57) ABSTRACT

An junction field effect transistor (JFET) is fashioned with a patterned layer of silicide block (SBLK) material utilized in forming gate, source and drain regions. Utilizing the silicide block in this manner helps to reduce low-frequency (flicker) noise associated with the JFET by suppressing the impact of surface states, among other things.

34 Claims, 19 Drawing Sheets

SILICIDE BLOCK ISOLATED JUNCTION FIELD EFFECT TRANSISTOR SOURCE, DRAIN AND GATE

FIELD OF INVENTION

The present invention relates generally to semiconductor processing, and more particularly to fashioning a junction field effect transistor (JFET) where a silicide block (SBLK) material is utilized in forming gate, source and drain regions.

BACKGROUND OF THE INVENTION

It can be appreciated that different electronic devices may have different requirements depending upon a particular device's application. For example, operational amplifiers used in precision analog applications have to be able to operate at relatively high voltages while experiencing little to no leakage due to the high voltages and correspondingly high drive currents. It is also desirable for such devices to experience very little low frequency noise and to be very stable such that offset voltages shift very little.

One basic building block of semiconductor circuitry and electronic devices, such as operational amplifiers, is a junction field effect transistor (JFET). It can thus be appreciated that it would be desirable to fashion a JFET that could be operated at high voltages and drive currents while experiencing little to no leakage, and that also experiences very little low frequency noise and has very stable offset voltages so that the device would be suitable for use in precision analog applications, for example.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The disclosure herein pertains to fashioning a junction field effect transistor (JFET) where a silicide block (SBLK) material is used in forming gate, source and drain regions of the transistor. Utilizing SBLK material in this manner helps to reduce low-frequency (flicker) noise associated with the JFET by suppressing the impact of surface states, among other things.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1A:
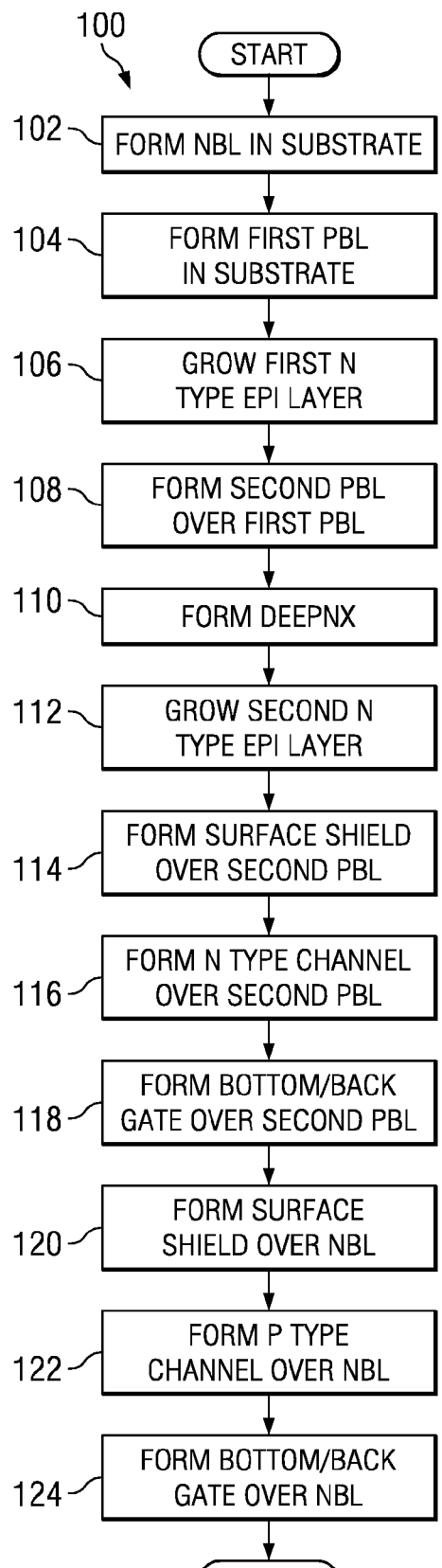
FIGS. 1A and 1B illustrate a flow diagram of an exemplary methodology for forming a junction field effect transistor (JFET).
Figure 1B:
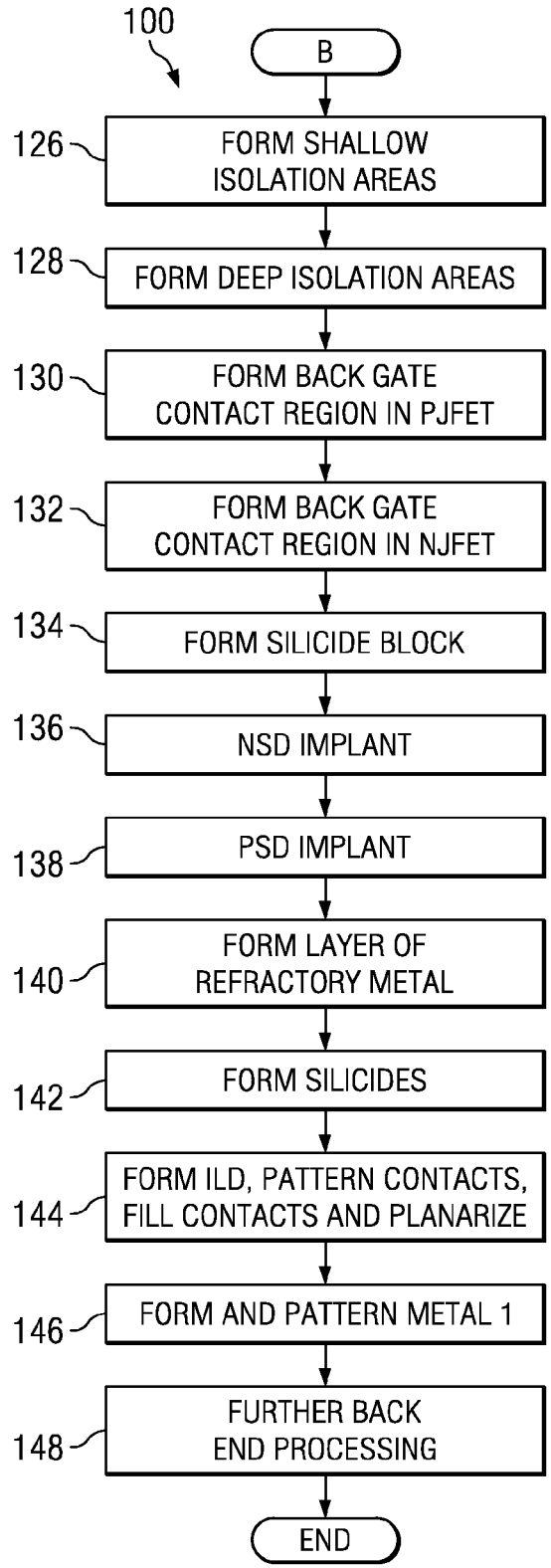

One or more aspects and/or embodiments of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

An exemplary methodology 100 for forming a junction field effect transistor (JFET) is illustrated in FIGS. 1A and 1B, and FIGS. 2-35 are cross-sectional views of a semiconductor substrate 200 wherein such a method is implemented. It will be appreciated that the method 100 has application to both an n channel JFET or NJFET and a p channel JFET or PJFET, where the electrical conductivity types are generally just reversed in NJFET and PJFET transistors. Additionally, while the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present invention. Further, one or more of the acts depicted herein may be carried out in one or more separate acts and/or phases.

Figure 2:
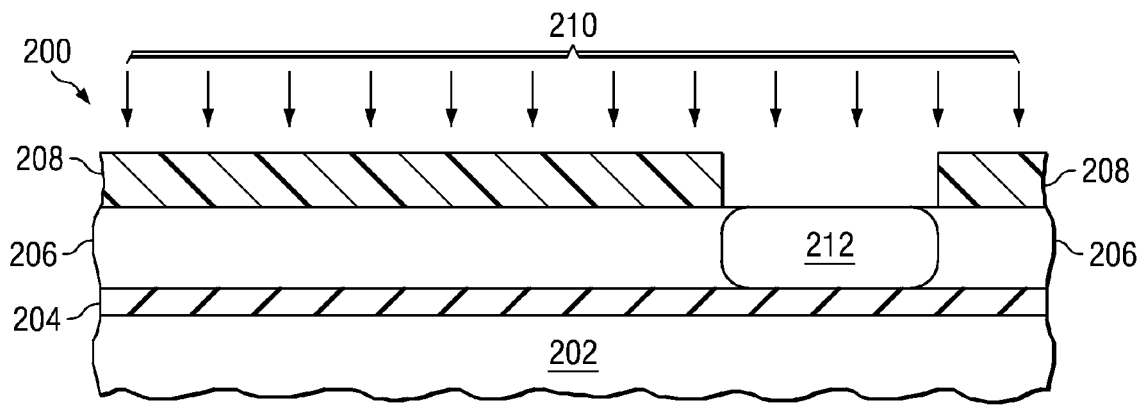
FIGS. 2-35 are cross-sectional illustrations of a semiconductor substrate wherein an exemplary JFET is formed.

At the outset, a first resist 208 is formed and patterned over the substrate 200 or workpiece and a first implantation 210 of one or more n type dopants is performed at 102 to form a first n type buried layer (NBL1) 212 in a (lightly doped n or p type) top silicon portion 206 of workpiece 200 above a buried oxide (BOX) portion 204 of the workpiece (FIG. 2). It will be appreciated that while the illustrated substrate 200 comprises a support portion 202, the BOX 204 and the top 206, that substrate as referred to herein may comprise any type of semiconductor body (e.g., silicon, SiGe) such as a semiconductor wafer or one or more die on a wafer, as well as any other type of semiconductor and/or epitaxial layers grown thereon and/or otherwise associated therewith. It will also be appreciated that the patterning of the first resist 208 (as with all masking and/or patterning mentioned herein) can be performed in any suitable manner, such as with lithographic techniques, for example, where lithography broadly refers to processes for transferring one or more patterns between various media. Additionally, while many implantations are described herein to dope or add dopant atoms and/or other agents/impurities to treated regions, it will be appreciated that regions can be doped by different techniques, such at diffusion, for example, and that such other doping operations are not intended to be excluded merely because implantations are referred to herein.

Figure 3:
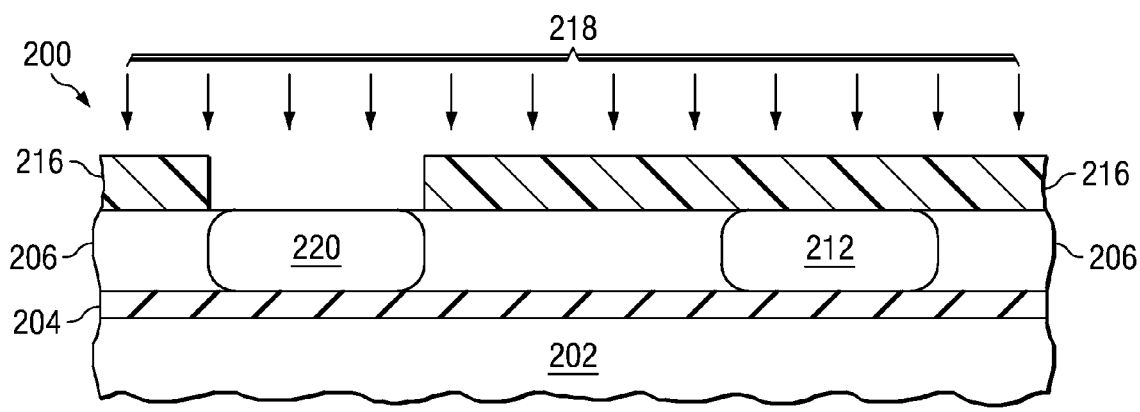
Figure 4:
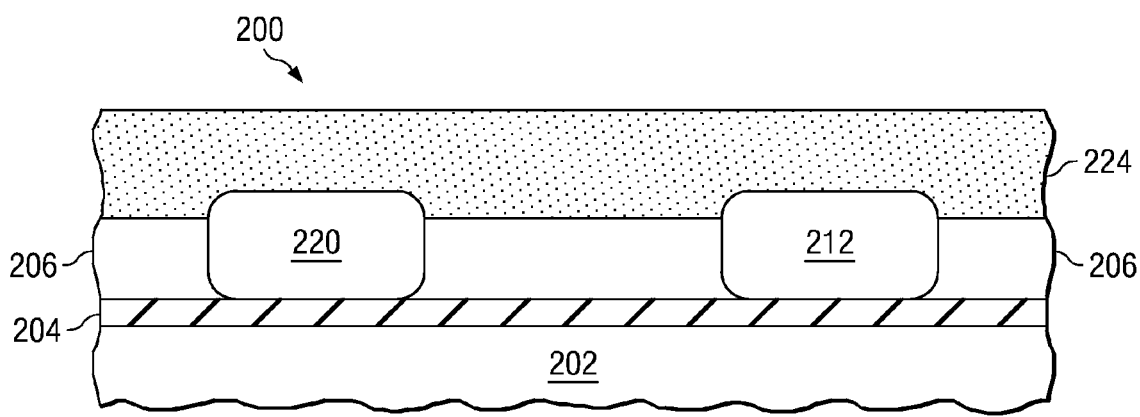

The first resist 208 is then stripped and a second resist 216 is formed and patterned over the substrate 200 or workpiece and a second implantation 218 of one or more p type dopants is performed at 104 to form a first p type buried layer (PBL1) 220 in the top silicon portion 206 of workpiece 200 (FIG. 3). The second resist 216 is then stripped and a first layer of n type material is epitaxially grown (NEPI1) 224 over the top silicon portion 206 of the workpiece 200 at 106 (FIG. 4). It will be appreciated that the NBL1 212 and the PBL1 220 migrate up a little into NEPI1 224 as a result of the growth process, such as from increased temperatures, for example.

Figure 5:
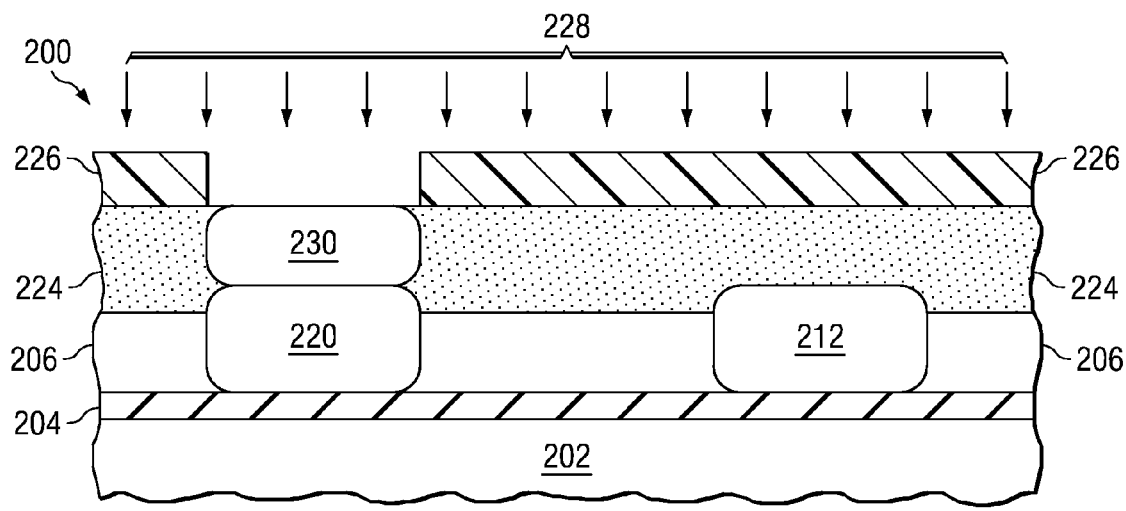

At 108, a third resist 226 is formed and patterned over the NEPI1 layer 224 and a third implantation 228 of one or more p type dopants is performed to form a second p type buried layer (PBL2) 230 (FIG. 5). The PBL2 230 is formed substantially in the NEPI1 layer 224 and over the PBL1 220. While the PBL1 220 and the PBL2 230 may merge slightly (e.g., at their interface), the PBL2 230 is generally formed such that it has a concentration of p type dopants that is typically less than the concentration of p type dopants in the PBL1 220. As with all dopant concentrations recited herein, the concentration of dopants in the PBL2 230 is nevertheless consistent with the high-voltage and/or breakdown voltage requirements of the structure. Additionally, the PBL2 230 may be formed by multiple (e.g., four) implants carried out at various energies and/or doses.

Figure 6:
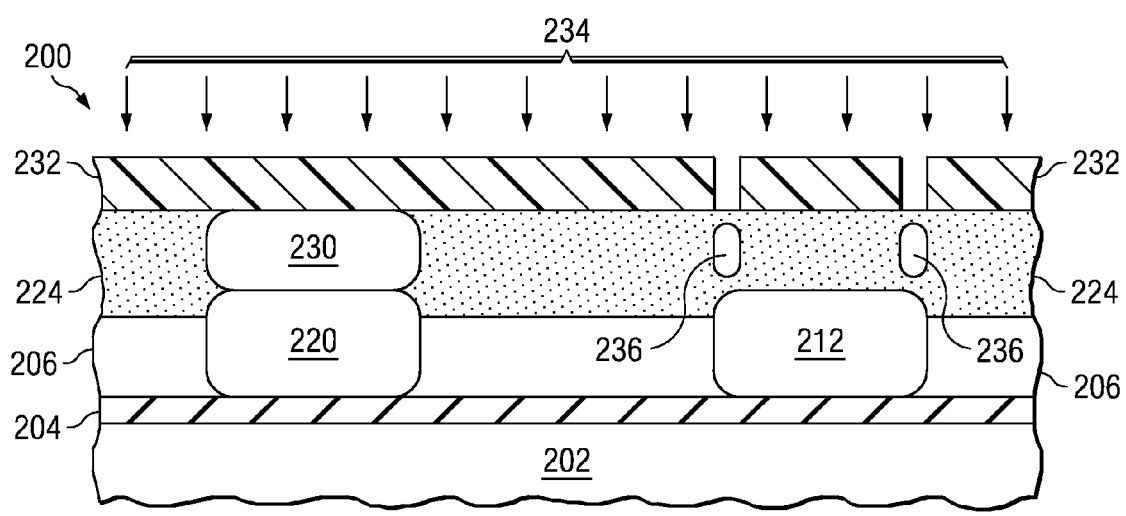

The third resist 226 is then stripped and a fourth resist 232 is formed and patterned over the NEPI1 layer 224 and a fourth implantation 234 of one or more n type dopants is performed at 110 to form one or more DEEPNX 236 regions in the NEPI1 layer 224 over the NBL1 212 (FIG. 6). As will be appreciated, these doped regions 236 comprise an abundance of n type dopant carriers, and thus serve to reduce a down contact resistance. Like the PBL2 230, these regions 236 may be formed by multiple (e.g., four) implants carried out at various energies and/or doses.

Figure 7:
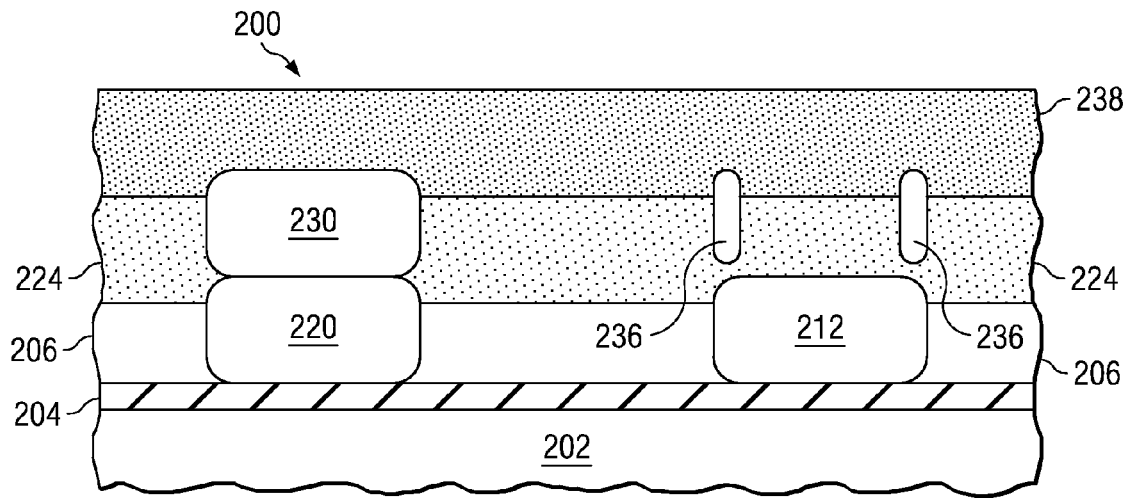

The fourth resist 232 is stripped and a second layer of n type material is epitaxially grown (NEPI2) 238 over the NEPI1 224 at 112 (FIG. 7). The NEPI2 layer 238 is formed such that it has a concentration of n type dopants that is substantially the same as the concentration of n type dopants in the NEPI1 layer 224. As when the NEPI1 224 layer is formed, the PBL2 230 migrates up a little when the NEPI2 238 is formed.

Figure 8:
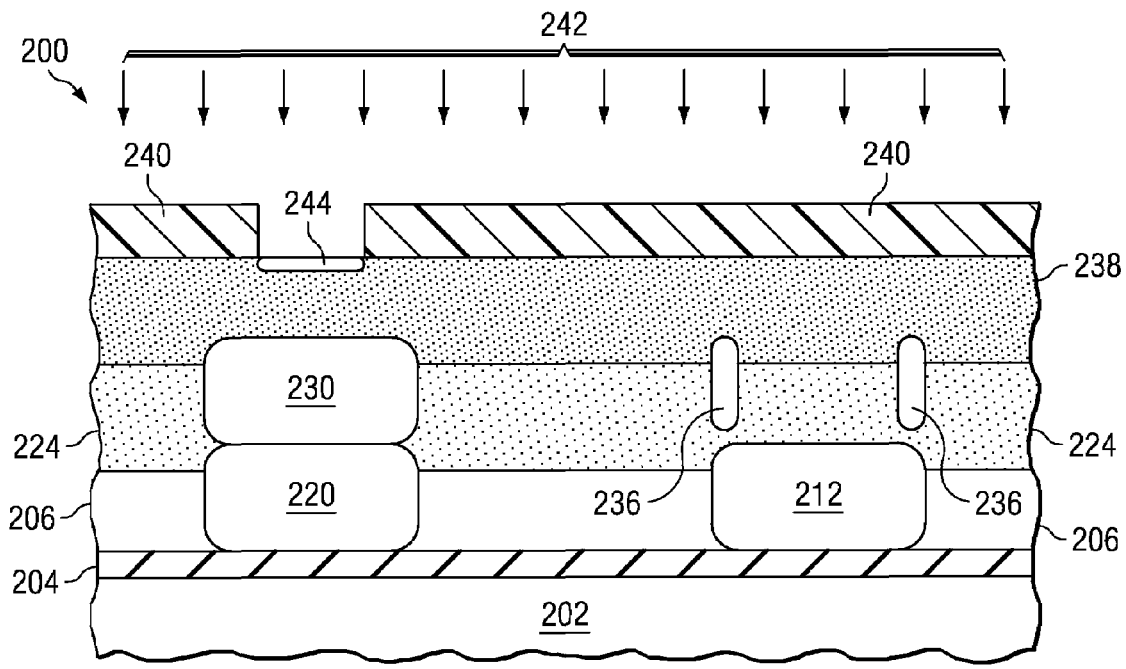

At 114, a fifth resist 240 is formed and patterned over the NEPI2 layer 238 and a fifth implantation 242 of one or more p type dopants is performed to form a p type surface shield or thin skin 244 across the surface of the NEPI2 layer 238 over the PBL2 230 (FIG. 8). The surface shield 244 is formed to have a concentration of p type dopants that is typically less than the concentration of dopants in subsequently formed source and drain regions. Additionally, the shield 244 is formed so that it is shallower than the subsequently formed source and drain regions. More generally, the shield 244 is formed to a concentration and depth that facilitates adequate shielding while keeping impact ionization current below a specified maximum level.

Figure 9:
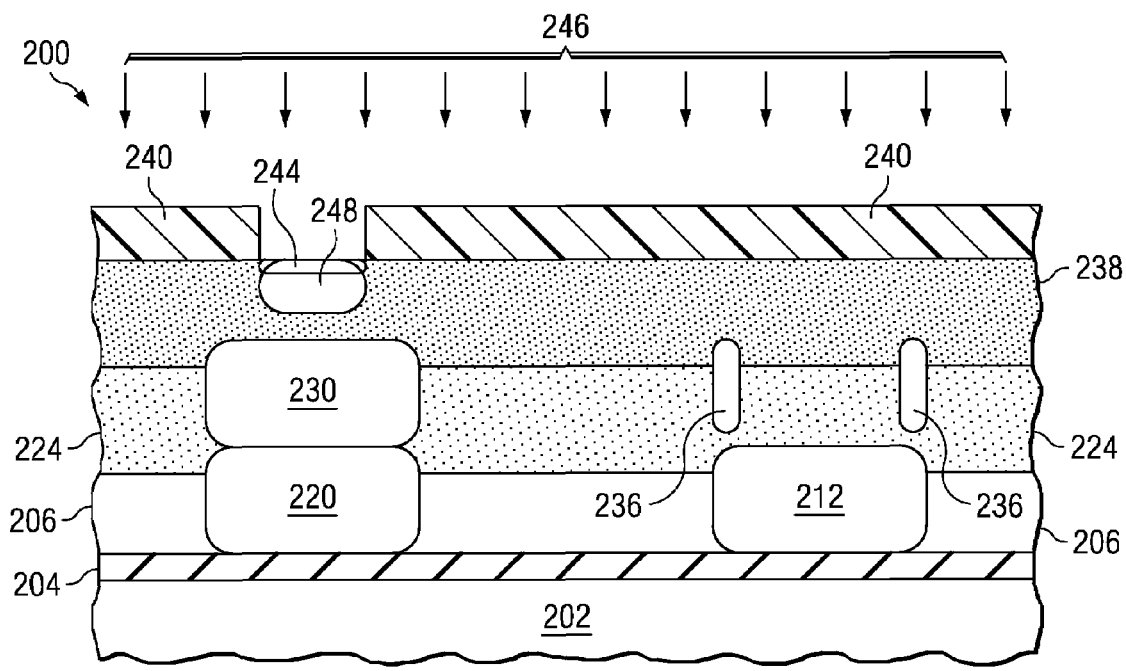

At 116, a sixth implantation 246 of one or more n type dopants is performed to form an n type channel 248 in the NEPI2 layer 238 (FIG. 9). The channel 248 is formed to have a concentration of n type dopants that is typically greater than the concentration of n type dopants in the first NEPI1 layer 224. The impurity profile of the channel 244 is tailored to facilitate current drive and transconductance while maintaining impact ionization current below a specified maximum level. The channel 248 may, for example, be established by three n type implants, where each subsequent implant is performed at a decreased energy level than the previous implant, but where the dose remains substantially the same in each of the implants. Such a triple channel implant facilitates desired drive current, impact ionization current, and also improves the transconductance (gm) of the transistor. Alternatively, the channel may be formed by a single implant, a single implant with subsequent thermal treatment, and/or by multiple implants with increasing (rather than decreasing) energy levels.

Figure 10:
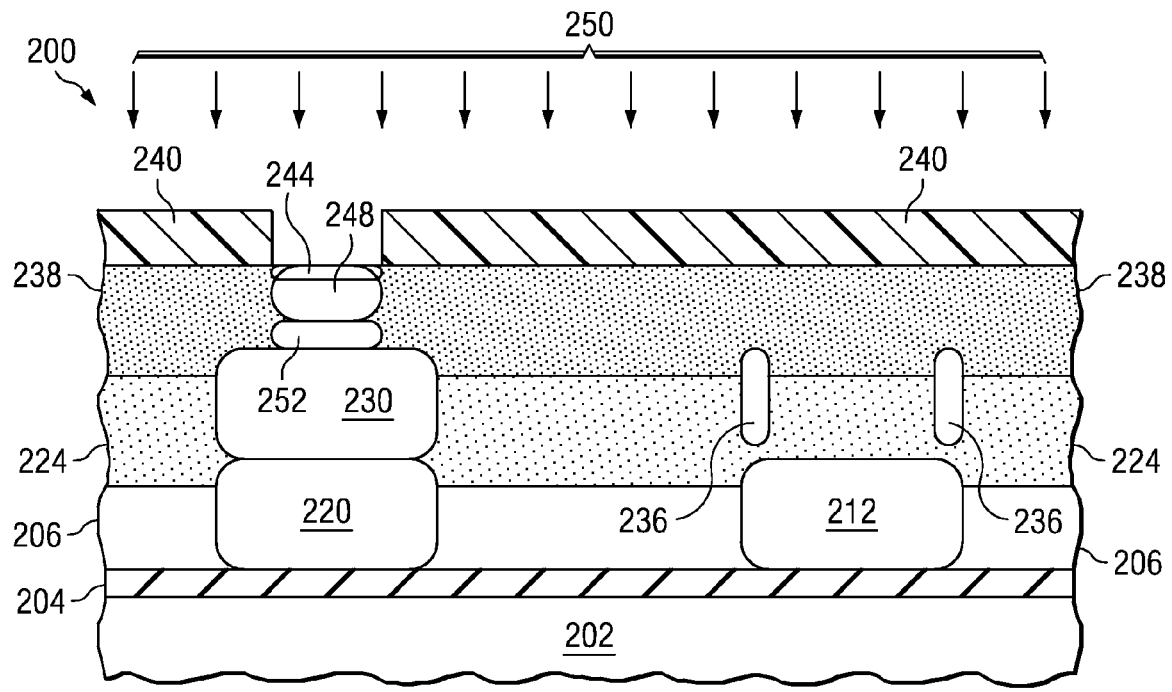

At 118, a seventh implantation 250 of one or more p type dopants is performed to form a back or bottom gate (BG) 252 substantially in a lower portion of the NEPI2 layer 238 (FIG. 10). Although the BG 252 may merge slightly with the underlying PBL2 230 (e.g., at their interface), the BG 252 is generally formed to have a concentration of p type dopants that is typically less than the concentration of p type dopants in the PBL2 230. It will be appreciated that the same mask 240 can be used to form the p type skin 244, the n type channel 248 and/or the p type BG 252, where the mask keeps dopants out of other devices (not shown) formed on the same workpiece. Utilizing the same mask streamlines the fabrication process and reduces costs—which is an ongoing desire in the semiconductor industry.

Figure 11:
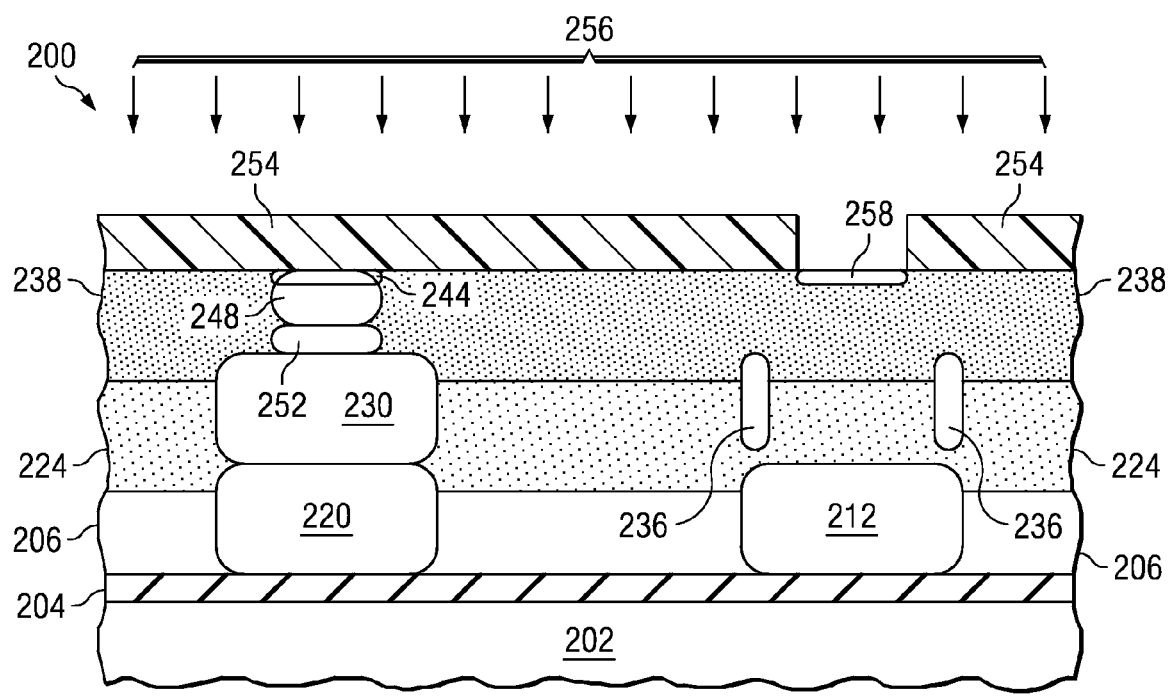

The fifth resist 240 is then stripped and a sixth resist 254 is formed and patterned over the NEPI2 layer 238 and an eighth implantation 256 of one or more n type dopants is performed at 120 to form an n type surface shield or thin skin 258 across the surface of the NEPI2 layer 238 over the NBL1 212 (FIG. 11). Like shield 244, the surface shield 258 is formed to have a concentration of n type dopants that is typically less than the concentration of dopants in subsequently formed source and drain regions. Additionally, the shield 258 is formed so that it is shallower than the subsequently formed source and drain regions. More generally, the shield 258 is formed to a concentration and depth that facilitates adequate shielding while keeping impact ionization current below a specified maximum level.

Figure 12:
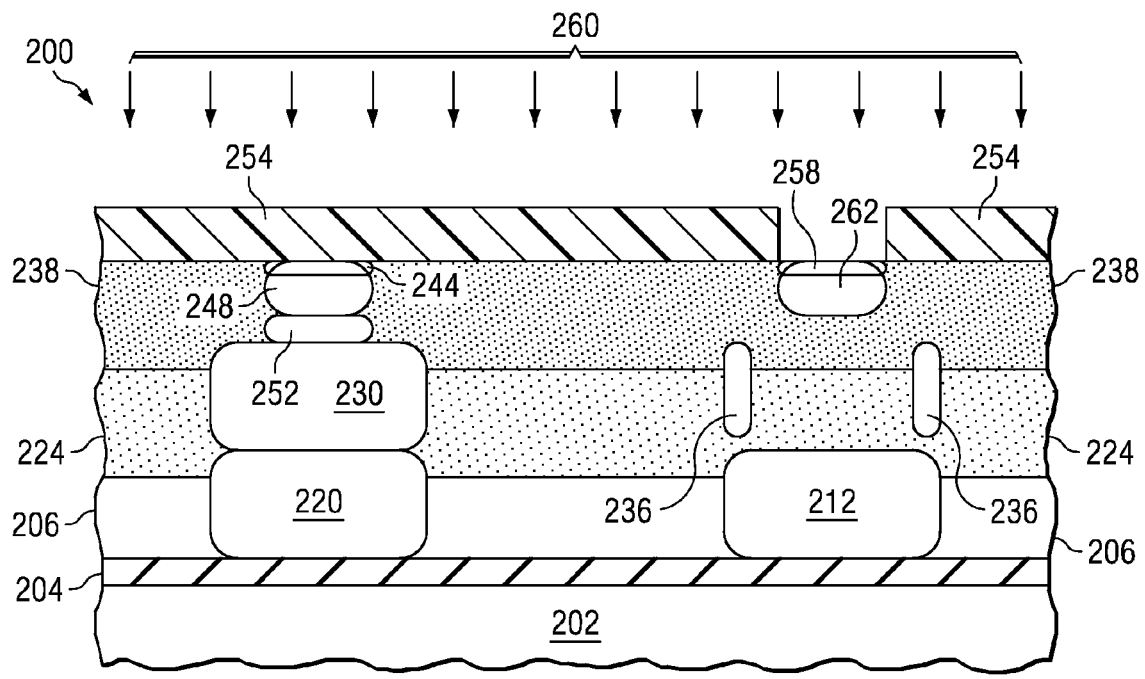

At 122, a ninth implantation 260 of one or more p type dopants is performed to form a p type channel 262 in the NEPI2 layer 238 (FIG. 12). The channel 262 is formed to have a concentration of p type dopants that is typically less than the concentration of n type dopants in the NBL1 212. The impurity profile of the channel 262 is tailored to facilitate current drive and transconductance while maintaining impact ionization current below a specified maximum level. Like channel 248, channel 262 may, for example, be established by three p type implants, where each subsequent implant is performed at a decreased energy level than the previous implant, but where the dose remains substantially the same in each of the implants. Such a triple channel implant facilitates desired drive current, impact ionization current, and also improves the transconductance (gm) of the transistor. Alternatively, the channel may be formed by a single implant, a single implant with subsequent thermal treatment, and/or by multiple implants with increasing (rather than decreasing) energy levels.

Figure 13:
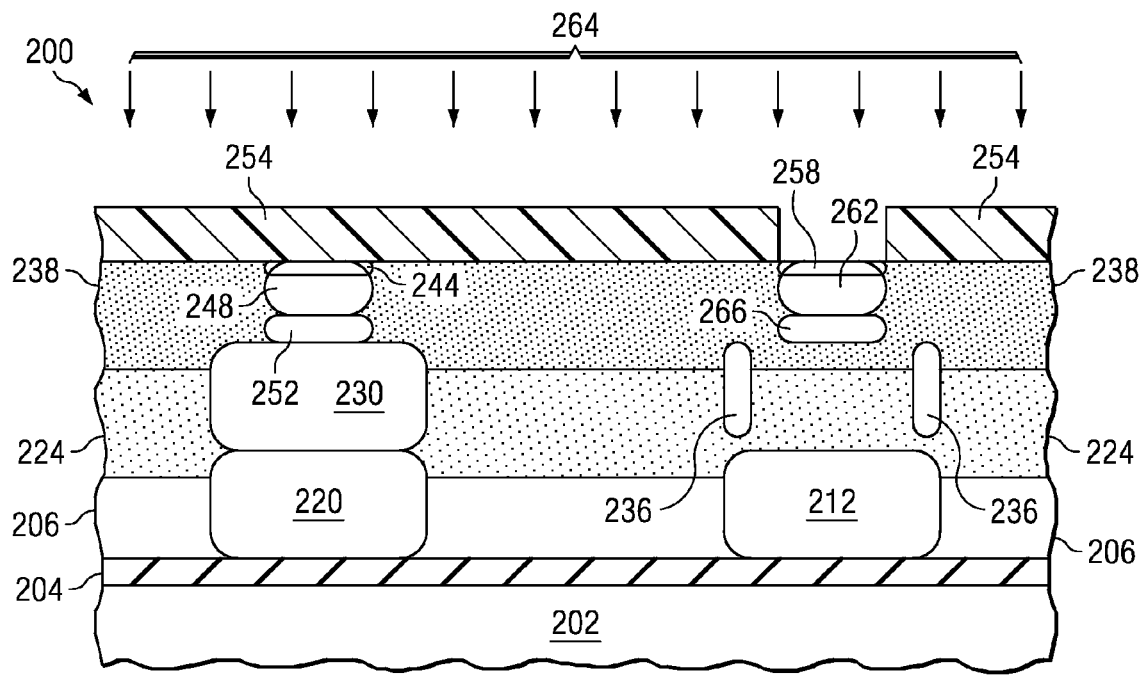

At 124, an optional tenth implantation 264 of one or more n type dopants is performed to form a back or bottom gate (BG) 266 substantially in a lower portion of the NEPI2 layer 238 (FIG. 13). It will be appreciated that this implantation is optional since the NEPI2 layer 238 already possesses an n type doping. It will also be appreciated that the same mask 254 can be used to form the n type skin 258, the p type channel 262 and/or the n type BG 266, where the mask keeps dopants out of other devices (not shown) formed on the same workpiece. Utilizing the same mask streamlines the fabrication process and reduces costs—which is an ongoing desire in the semiconductor industry.

Figure 14:
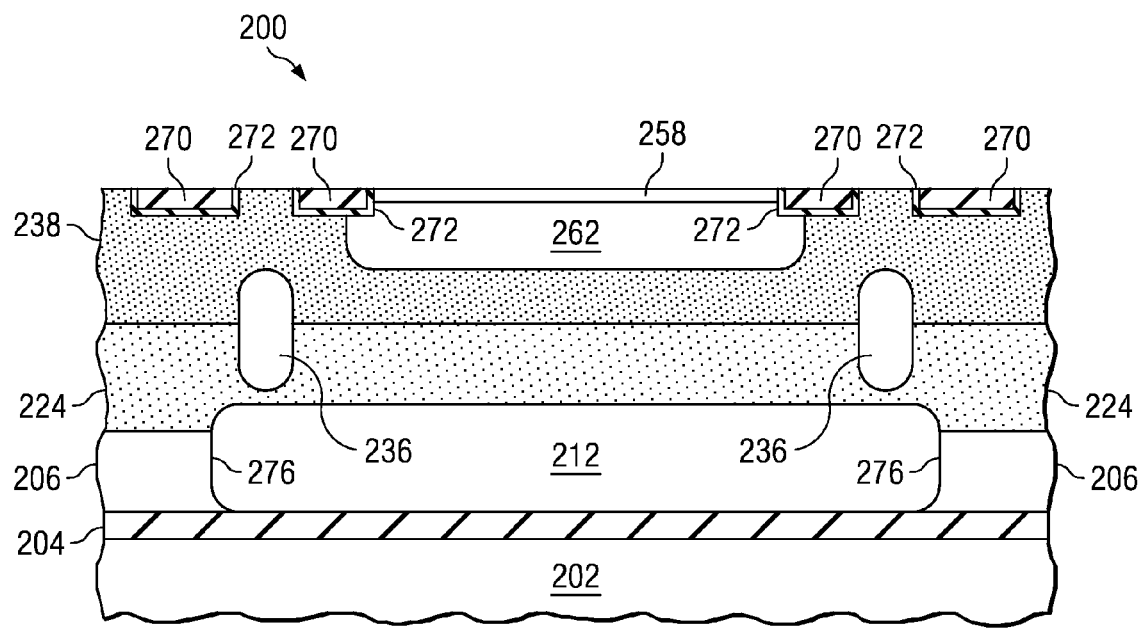
Figure 15:
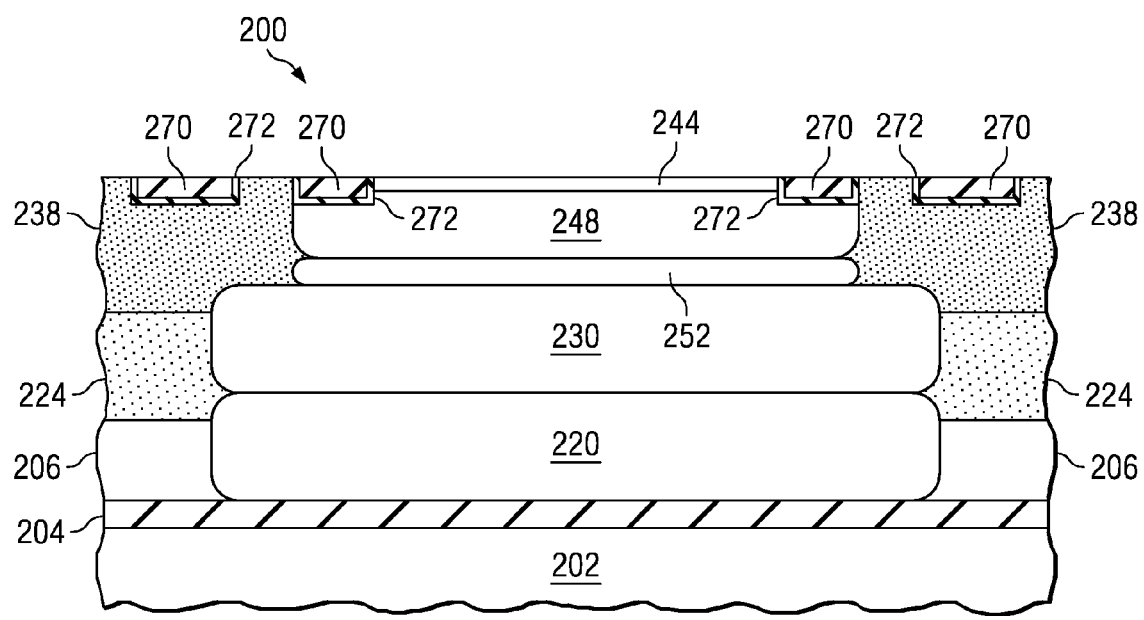

At 126, the sixth patterned resist 254 is stripped and shallow isolation areas 270 are formed in the workpiece 200. Turning to FIGS. 14 and 15, where FIG. 14 is a zoomed in view of the PJFET and FIG. 15 is a zoomed in view of the NJFET illustrated in the preceding figures, the shallow isolation areas 270 are formed in an upper part of the NEPI2 layer 238. The shallow isolation areas 270 can, for example, be formed with a mask (not shown) that facilitates etching trenches or apertures into the NEPI2 layer 238, where the trenches are then filled with a dielectric material. Additionally, a thin liner oxide 272 can be grown in the shallow trenches before the trenches are filled with the dielectric material. It will be appreciated that the shallow isolation areas 270 generally mitigate vertical and lateral parasitic capacitances and laterally isolate junctions from one another.

Figure 16:
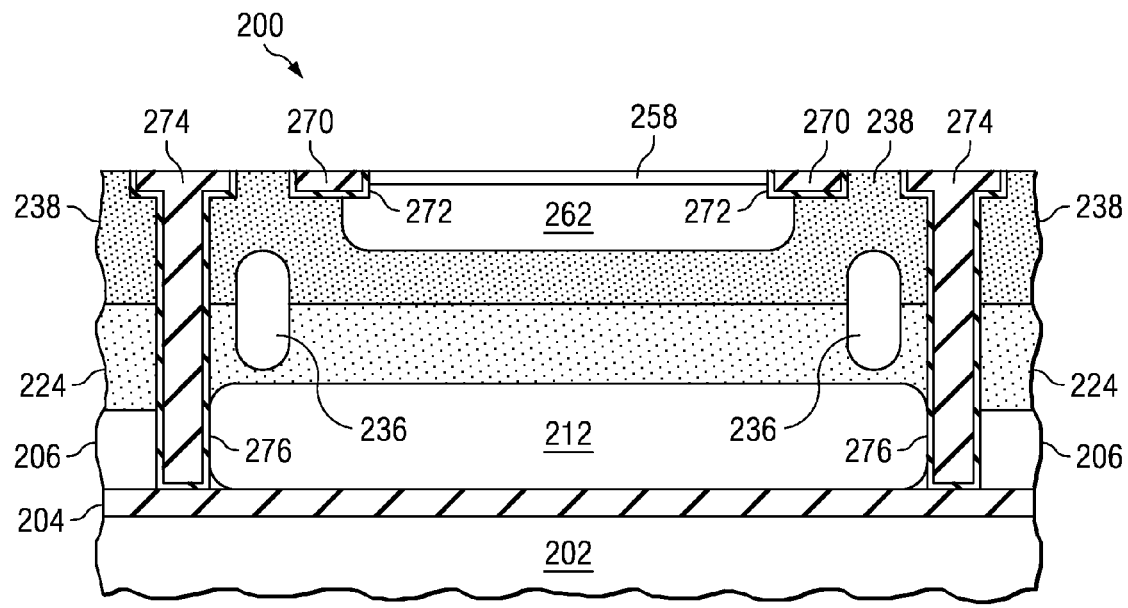
Figure 17:
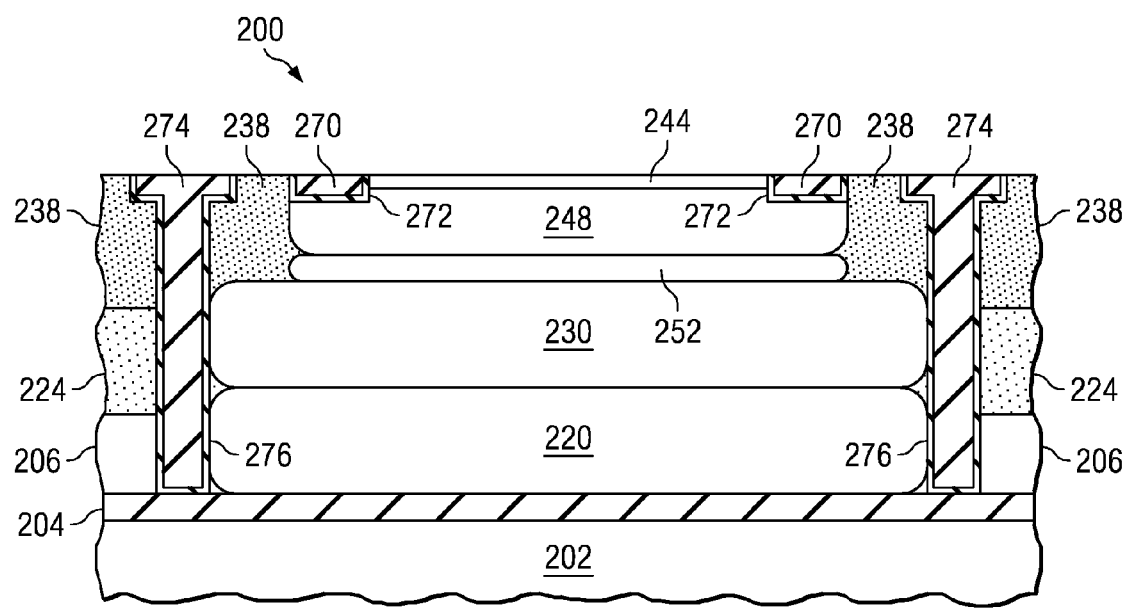

Turning to FIGS. 16 and 17, deep isolation areas 274 are formed in the workpiece 200 at 128, where FIG. 16 illustrates a zoomed in view of the PJFET and FIG. 17 illustrates a zoomed in view of the NJFET. Similar to the shallow isolation areas 270, the deep isolation areas 274 can, for example, be formed with a mask (not shown) that facilitates etching trenches or apertures down to the BOX 204, where the trenches are then filled with a dielectric material (e.g., sub-atmospheric chemical vapor deposition (SACVD) TEOS oxide). Further, a liner oxide 276 can be grown in the deep trenches before the dielectric filler is added. Although not illustrated, it will be appreciated that the liner oxide 276 may exist predominately on the sidewalls of the deep isolation areas 274 as little to no oxide forms on the BOX 204. It will be appreciated that the deep isolation areas 274 isolate the transistor from surrounding devices, such as other transistors, for example. It will also be appreciated that the deep isolation areas 274 can be formed before the shallow isolation areas 270.

Figure 18:
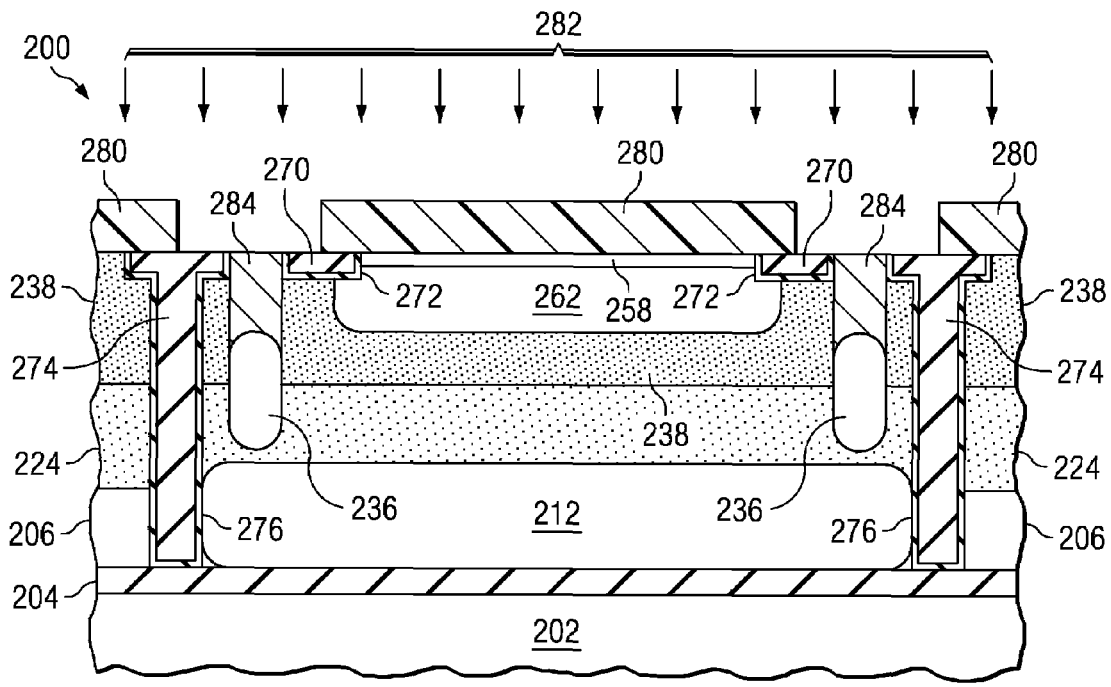

After the shallow 270 and deep 274 isolation areas are formed, a seventh resist 280 is formed and patterned over the NEPI2 layer 238 and an eleventh implantation 282 of one or more n type dopants is performed to form n back gate contact regions 284 in the PJFET at 130 (FIG. 18). It will be appreciated that these contact regions 284 may be formed with multiple implants (e.g., four) carried out at various energies and/or doses to reduce down contact resistance. Additionally, the implantation 282 is performed so that the concentration of n type dopants in the DEEPNX 236 is greater than the concentration of n type dopants in the NEPI2 layer 238 so that there is a continuous low resistance vertical n type pathway. The dopant profiles are thus chosen to reduce vertical resistance while meeting specifications on impact-ionization current.

Figure 19:
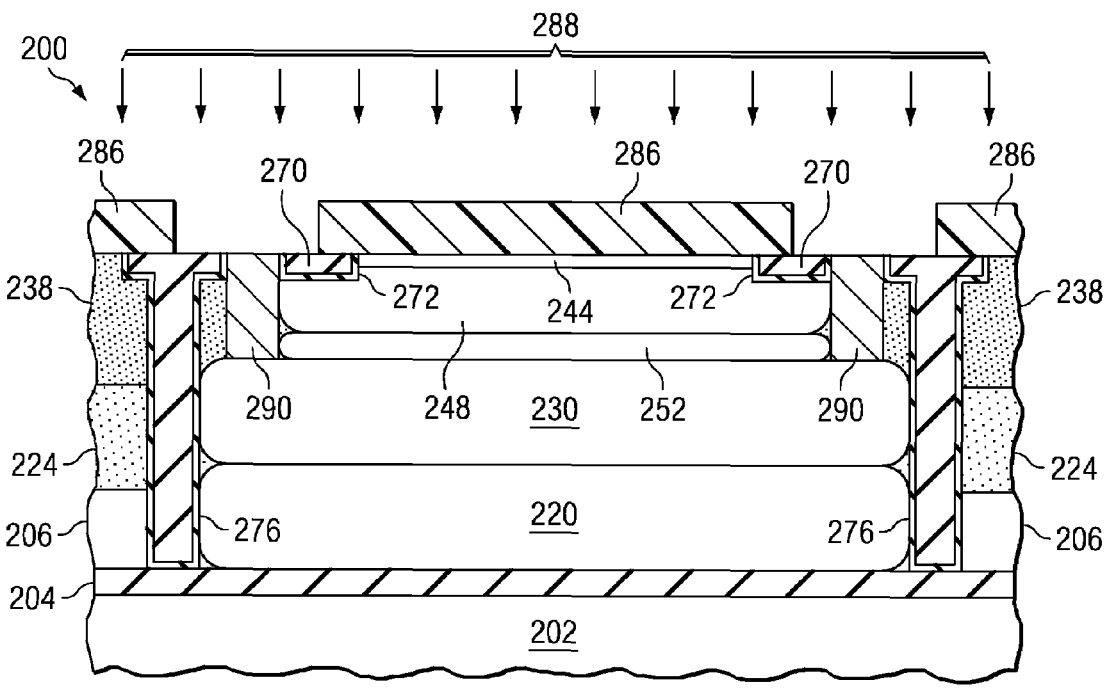

At 132, the seventh resist 280 is stripped and an eighth resist 286 is formed and patterned over the NEPI2 layer 238 and a twelfth 288 implantation of one or more p type dopants is performed to form p type back gate contact regions in the NJFET (FIG. 19). As with regions 284, regions 290 may be formed with multiple implants (e.g., four) carried out at various energies and/or doses to reduce down contact resistance.

Figure 20:
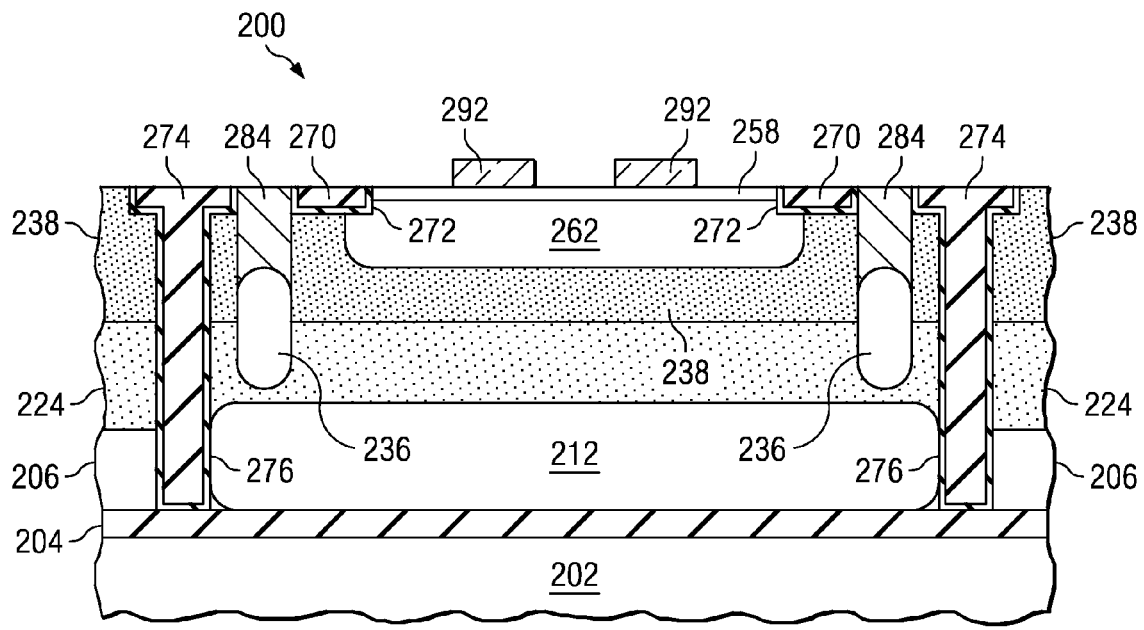
Figure 21:
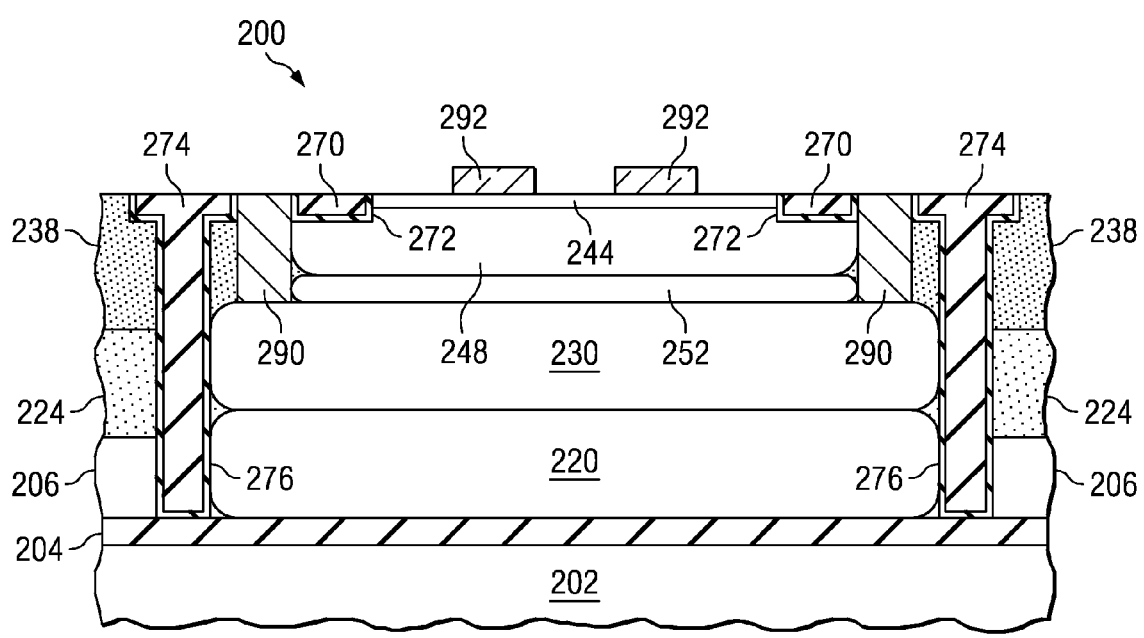
Figure 22:
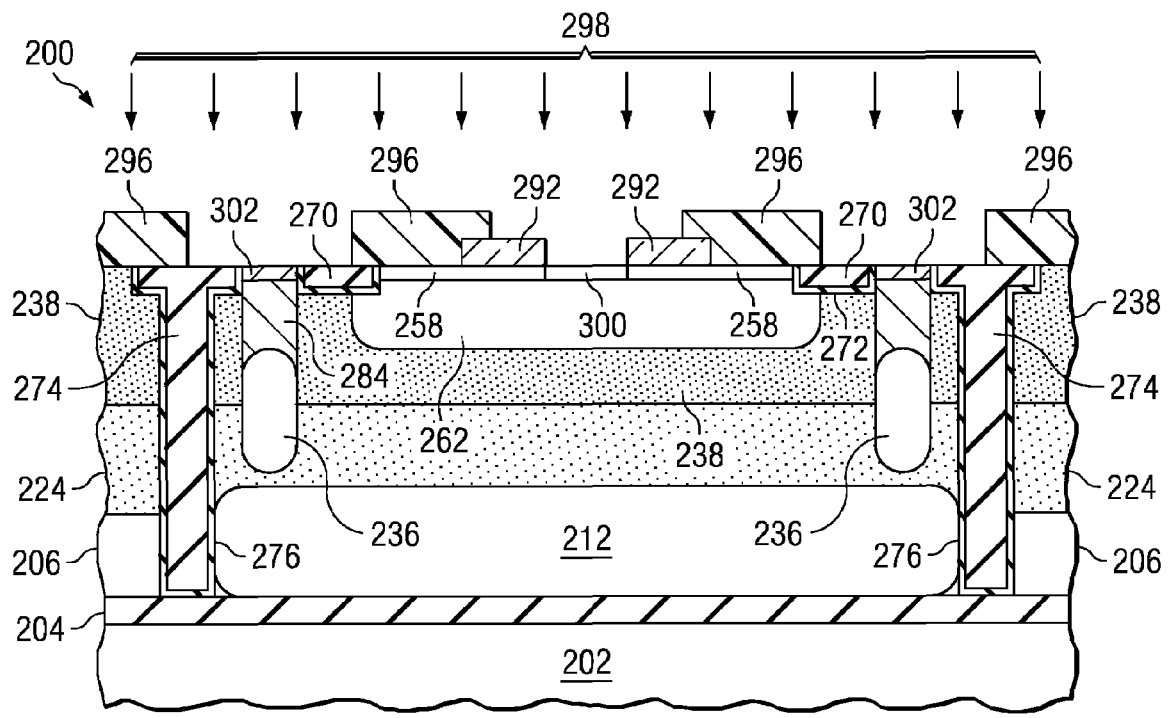

The eighth patterned resist 286 is stripped and a silicide block layer 292 is formed and patterned (e.g., with a mask—not shown) over the NEPI2 layer 238 at 134 (FIGS. 20 and 21). The suicide block 292 generally comprises insulating material, such as oxide and/or nitride, for example. It will be appreciated that the silicide block (SBLK) 292 serves to isolate conductive areas, such as subsequently formed gate, source and drain regions, for example, from one another. The SBLK 292 can be implemented instead of other isolation techniques without increasing the dimensions of the transistor so that valuable semiconductor real estate is conserved.

Figure 23:
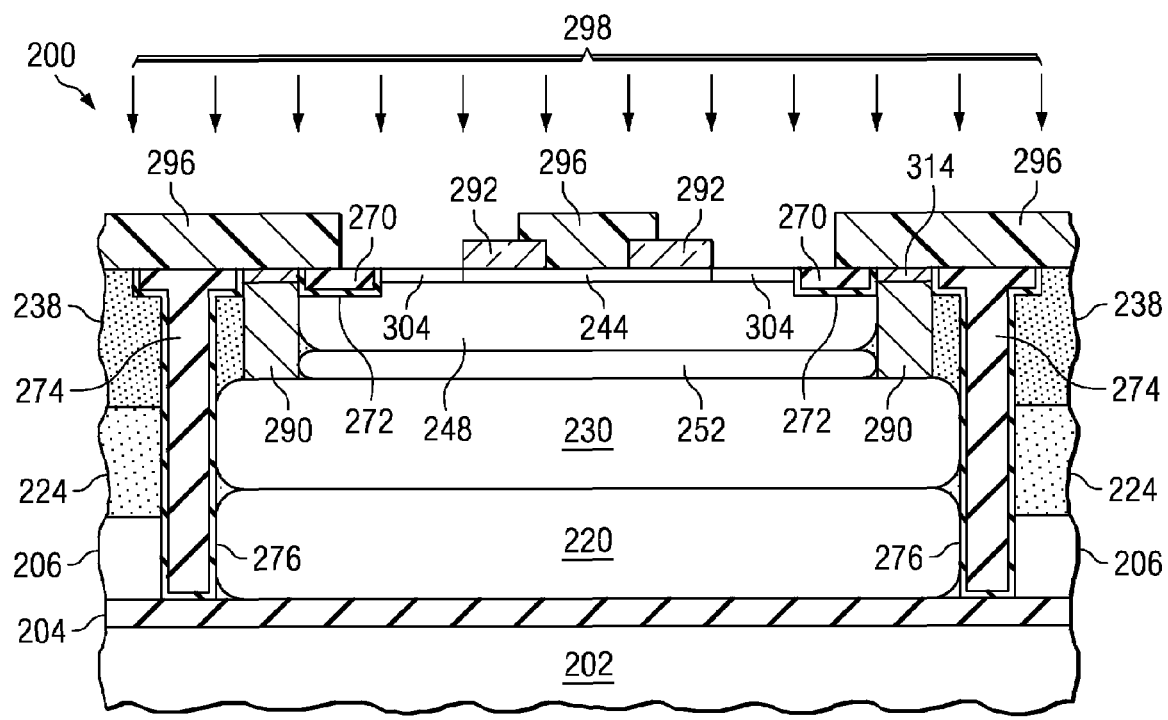
Figure 24:
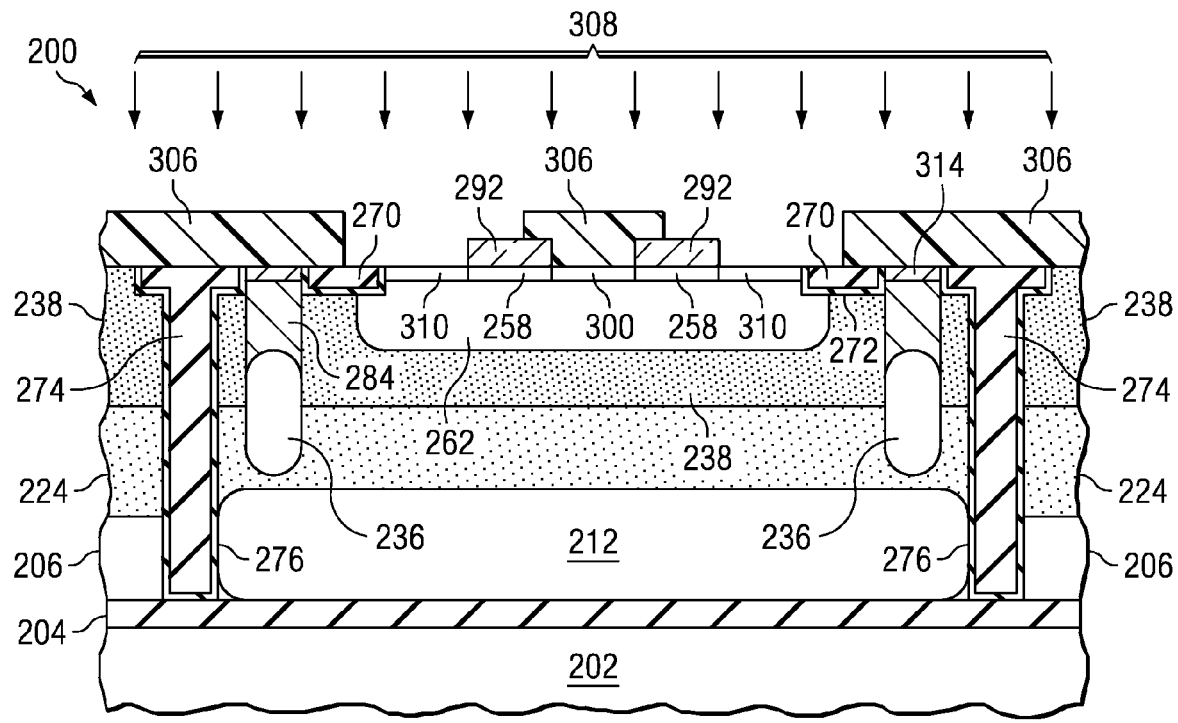

A ninth resist 296 is formed and patterned over the NEPI2 layer 238 and a thirteenth implantation 298 of one or more n type dopants is performed at 136 to form n type gate 300 and back gate 302 regions in the PJFET (FIG. 22) and to form n type source and drain regions 304 in the NJFET (FIG. 23). It will be appreciated that the SBLK 292 is sufficiently thick so as to block implantation/penetration of the n type dopants into underlying areas. Similarly, the dielectric material of the shallow 270 and deep 274 isolation areas is sufficiently thick to halt dopants from penetrating into underlying areas given the implantation energies.

Figure 25:
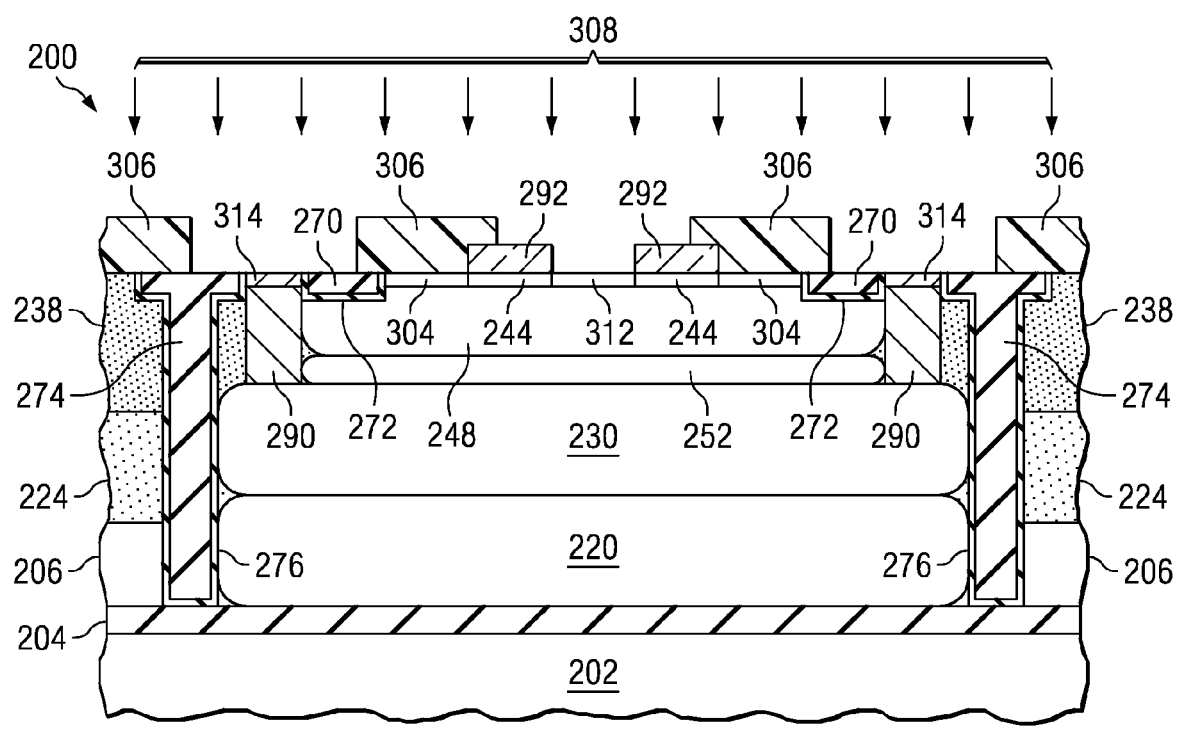

The ninth resist 296 is stripped and a tenth resist 306 is formed and patterned over the NEPI2 layer 238 and a fourteenth implantation 308 of one or more p type dopants is performed at 138 to form p type source and drain regions 310 regions in the PJFET (FIG. 24) and to form p type gate 312 and back gate 314 regions in the NJFET (FIG. 25). Again, the SBLK 292 and the dielectric material of the shallow 270 and deep 274 isolation areas blocks implantation/penetration of the dopants into underlying areas. It can thus be appreciated that the SBLK 292 serves to self align the source, drain and gate regions within the NEPI2 layer 238.

Figure 26:
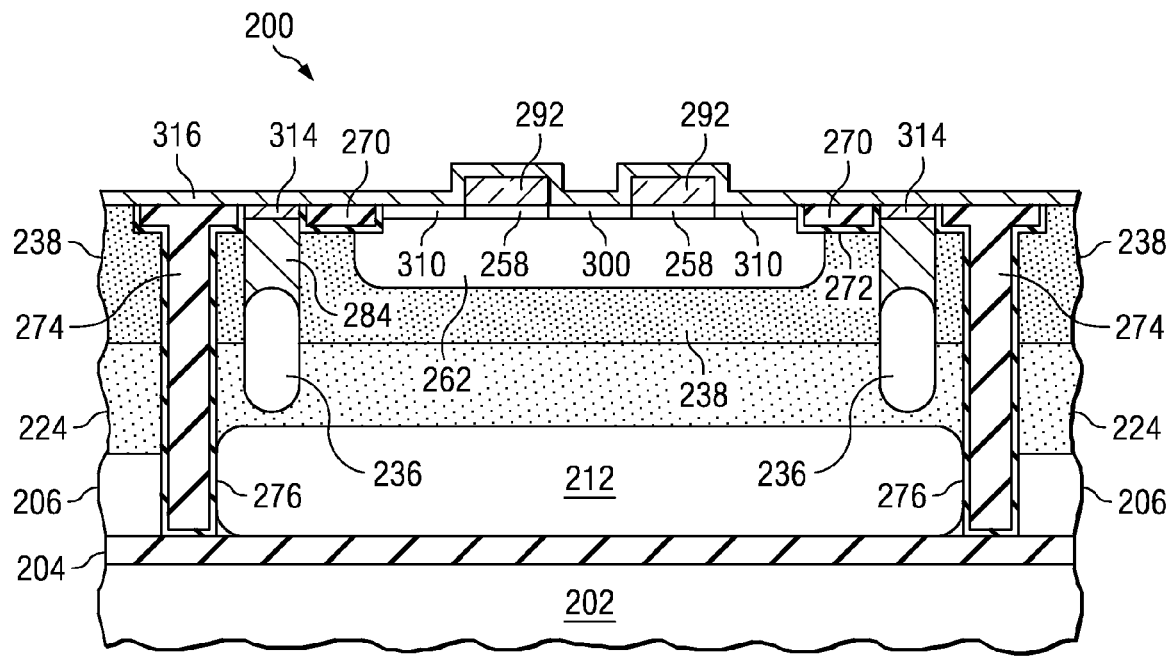
Figure 27:
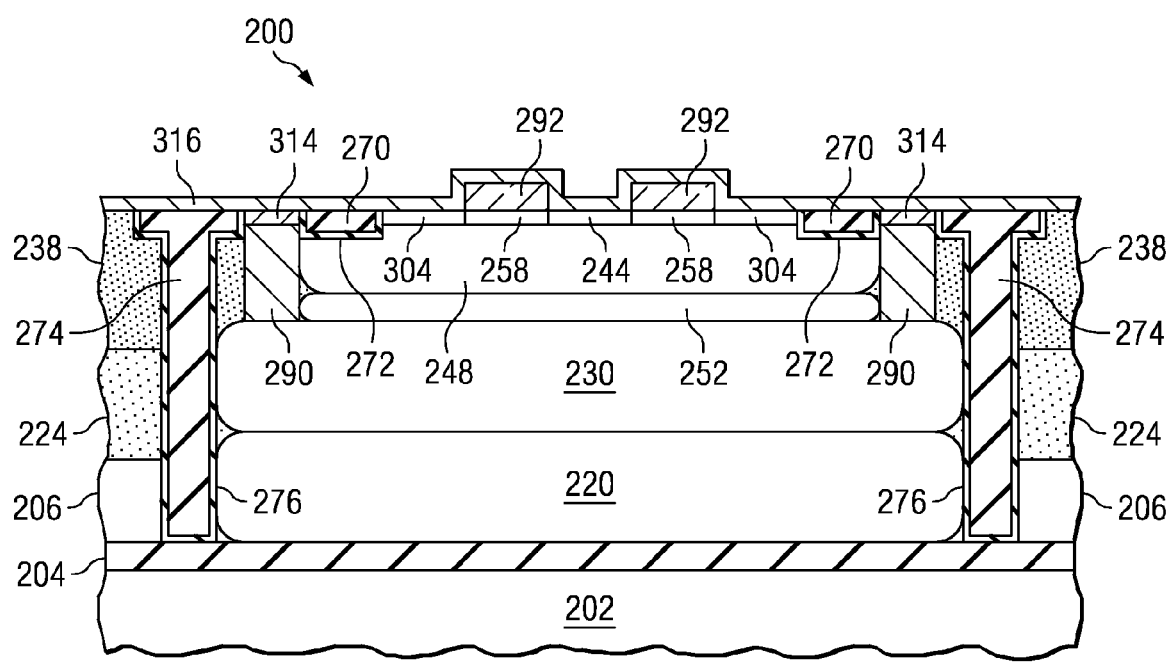
Figure 28:
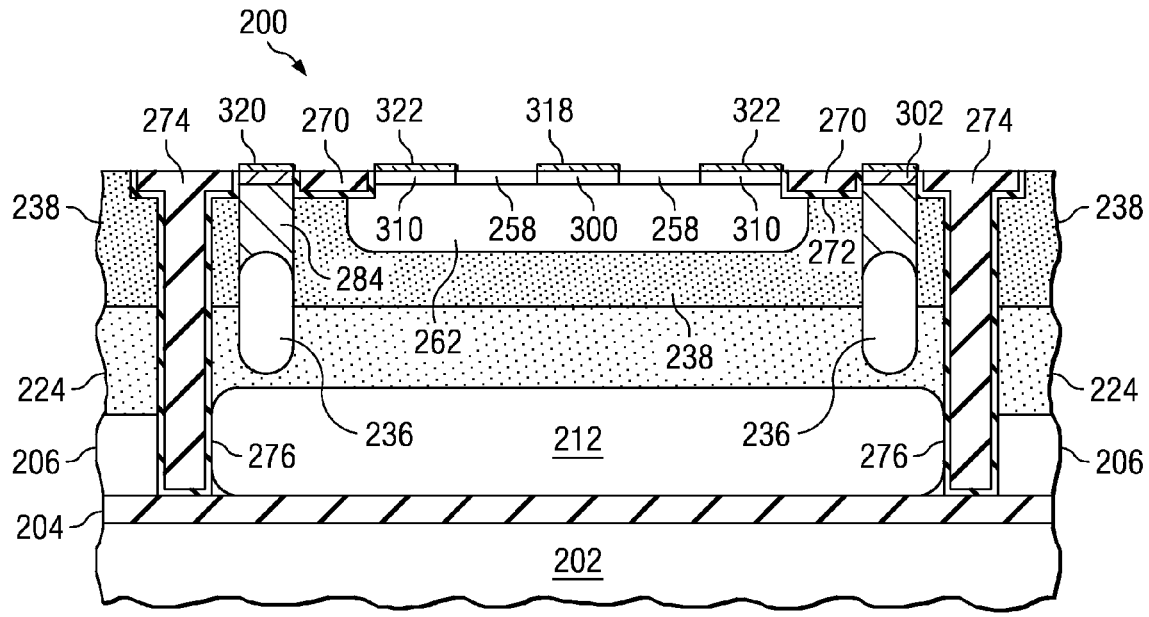
Figure 29:
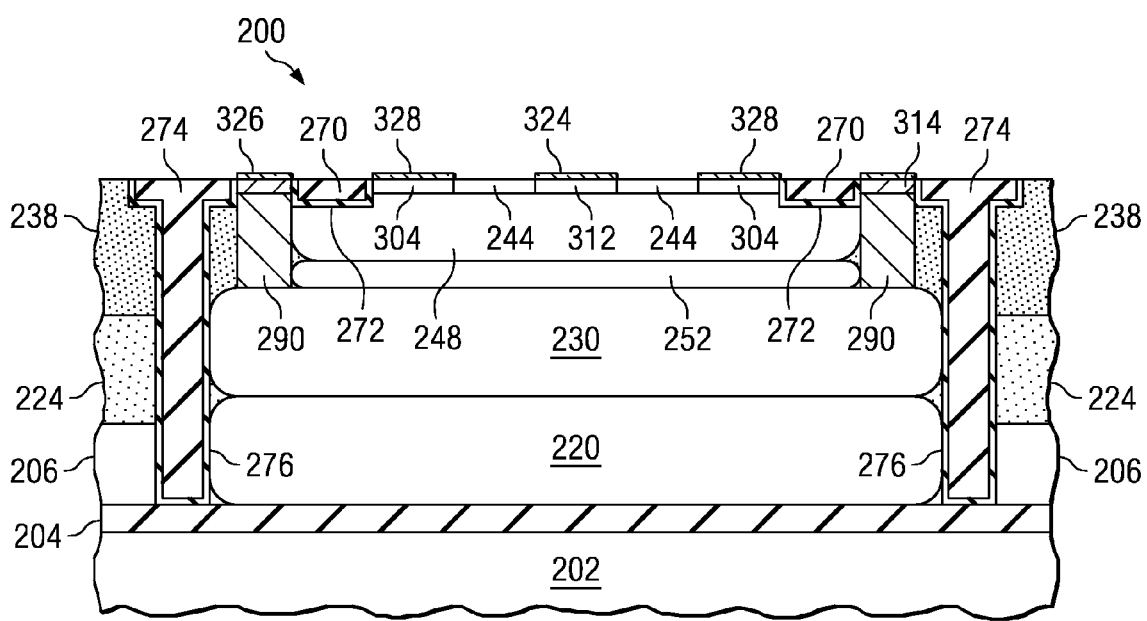

The tenth resist 306 is stripped and a layer of refractory metal 316 (e.g., cobalt based material) is formed (e.g., deposited) over the entire surface (FIGS. 26 and 27). The layer of refractory metal 316 is then processed (e.g., heated) at 142 so that it reacts with the silicon that it is in contact with to form silicides. In particular, suicides 318, 320 and 322 are formed over the gate 300, back gate 302 and source and drain 310 regions, respectively, of the PJFET (FIG. 28), while suicides 324, 326 and 328 are formed over the gate 312, back gate 314 and source and drain 304 regions, respectively, of the NJFET (FIG. 29). Excess un-reacted refractory metal is then removed (not shown).

Figure 30:
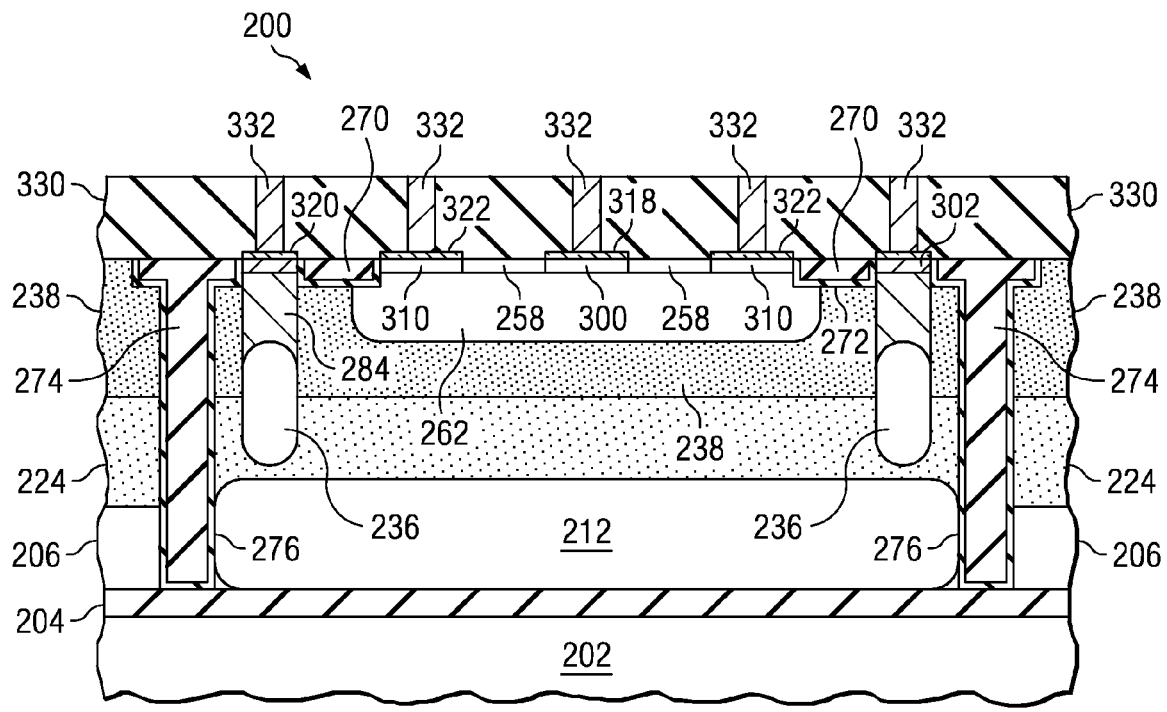
Figure 31:
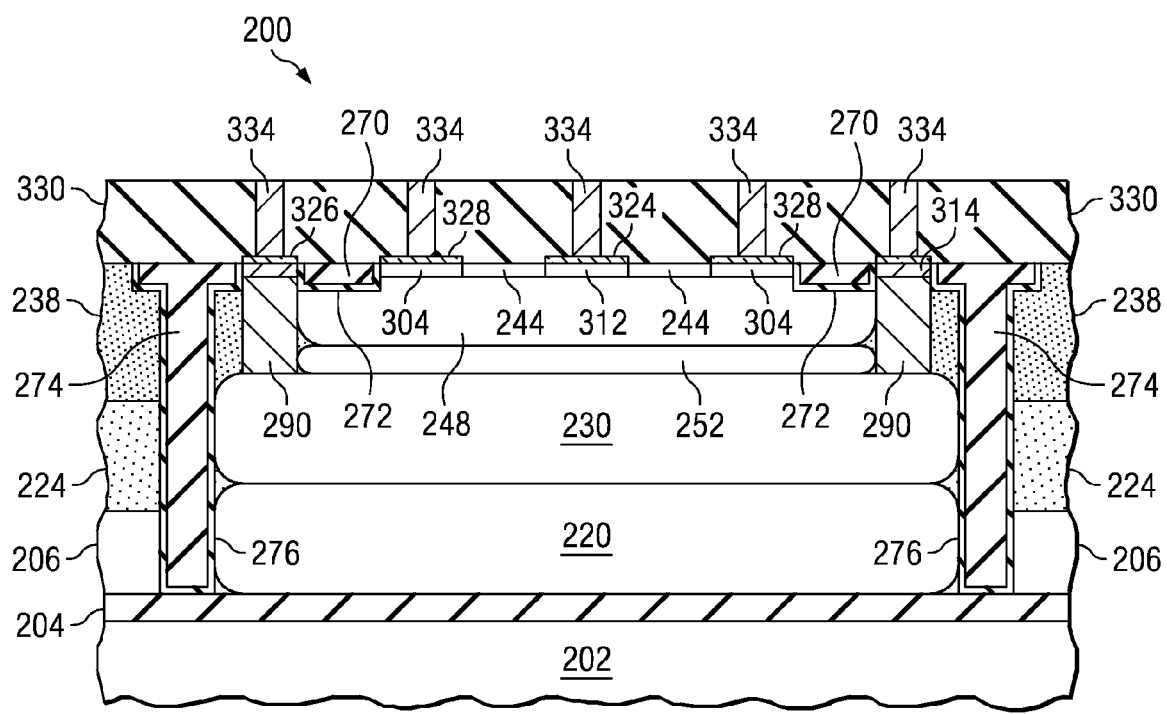

At 144, a layer of dielectric material (e.g., Inter-Level Dielectric (ILD), Boro-Phospho-Silicate Glass (BPSG)) 330 is formed over the NEPI2 layer 238 and the suicides (FIGS. 30 and 31). The ILD 330 is patterned (e.g., with a mask—not shown) down to the silicides, where the apertures in the patterned ILD 330 are then filled with a conductive material to form contacts 332 down to the silicides 318, 320, 322 in the PJFET (FIG. 30) and to form contacts 334 down to the silicides 324, 326, 328 in the NJFET (FIG. 31), and the contacts and ILD 330 are planarized to be smooth.

Figure 32:
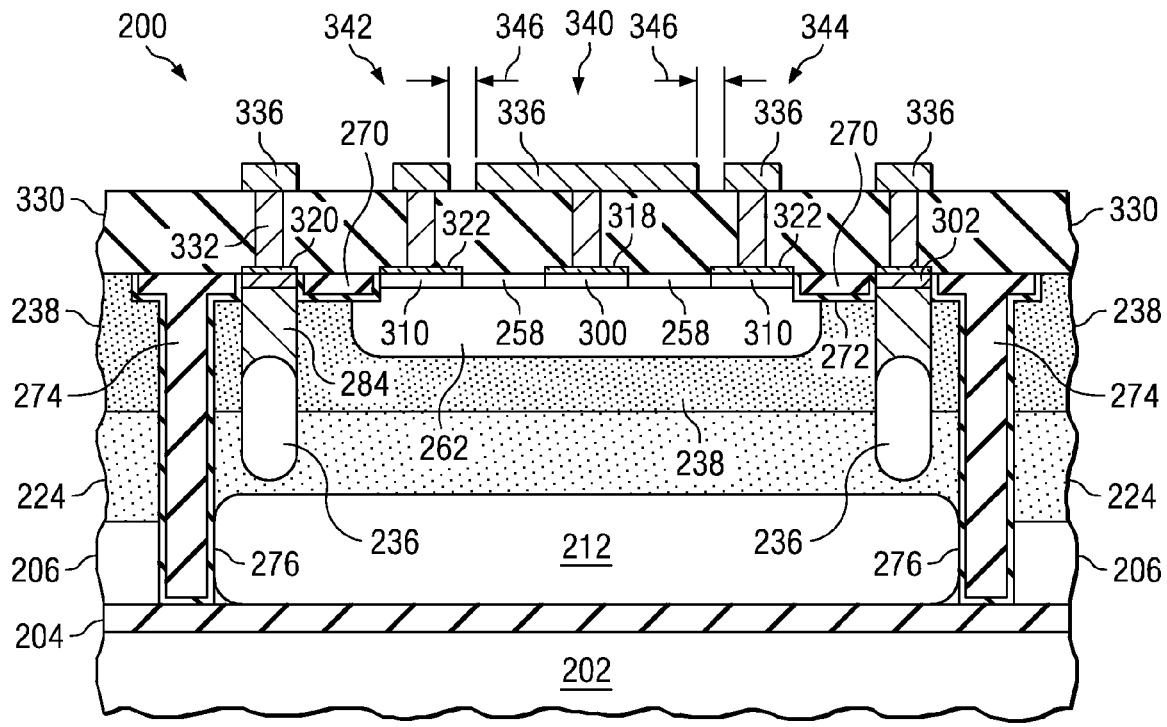
Figure 33:
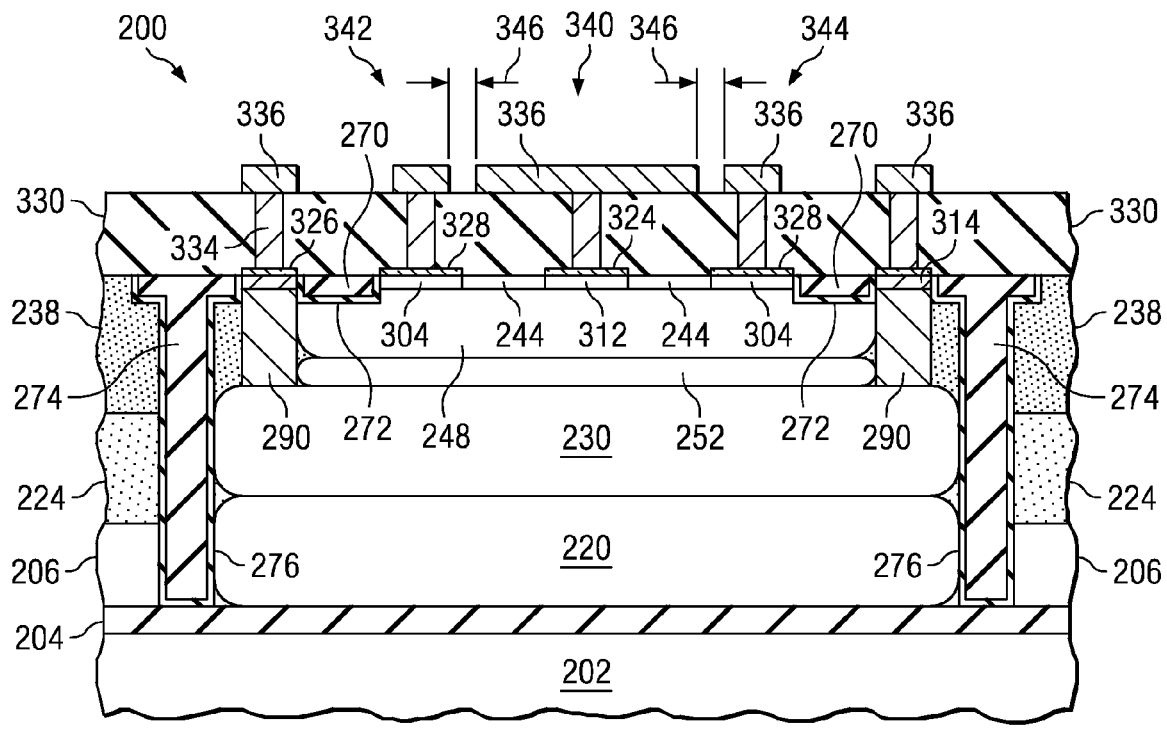
Figure 34:
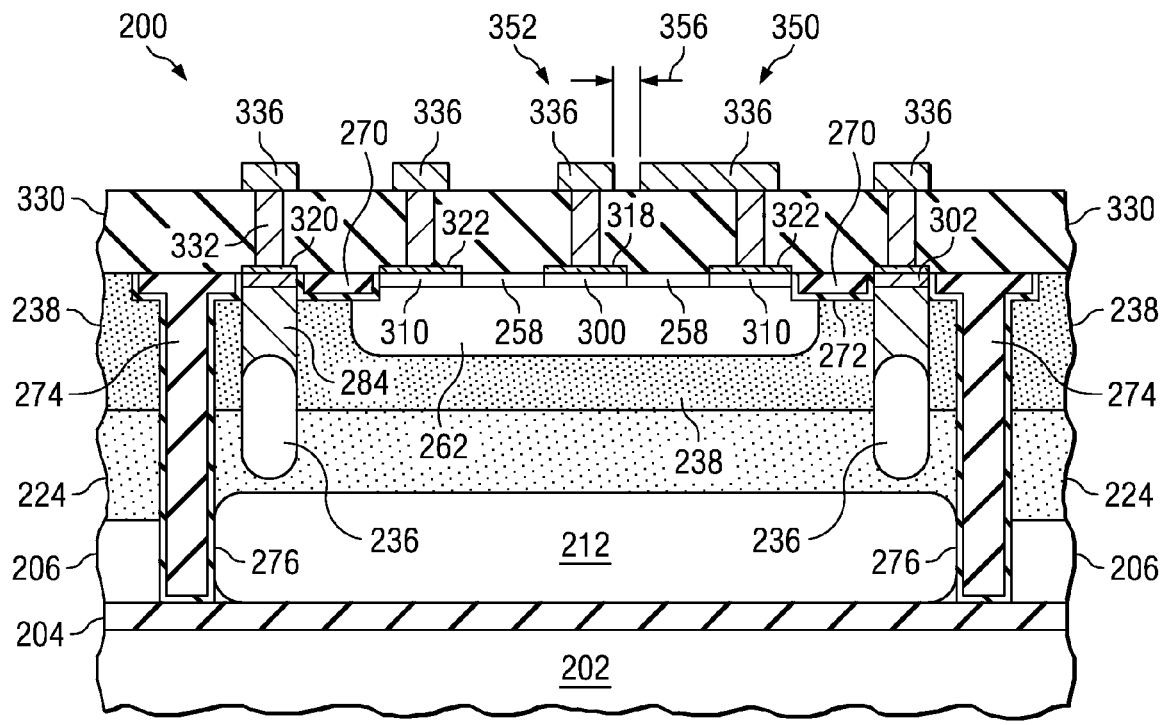
Figure 35:
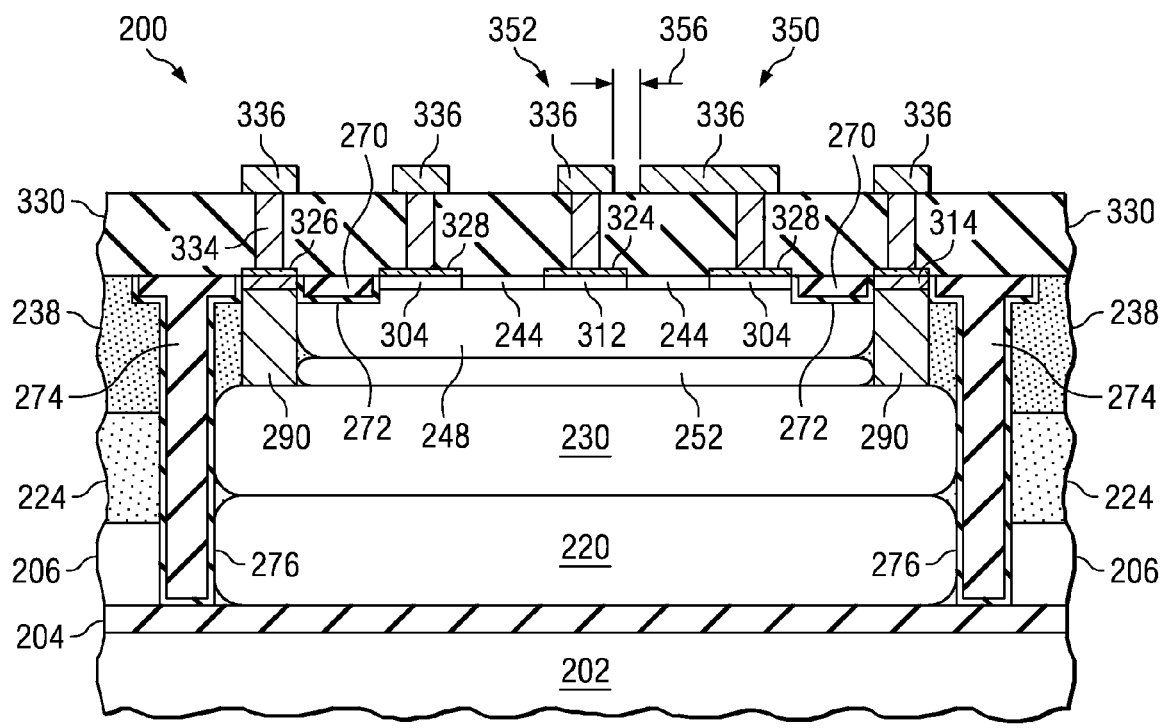

A layer of first metal (e.g., metal-1) conductive material (e.g., aluminum, copper) 336 is formed (e.g., deposited) and patterned (e.g., with a mask—not shown) over the ILD 330 and contacts 332, 334 at 146. In particular, the metal 336 is patterned so that some of it remains over the respective contacts 332, 334 in the PJFET and NJFET (FIGS. 32-35). In one example, the metal 336 is patterned so that a portion 340 of it remains over the respective gates 300, 312 of the PJFET and NJFET and extends so as to overlap at least some of the source and drain regions 310, 304 of the PJFET and NJFET (FIGS. 32 and 33). Portion 340 nevertheless is distanced from the portions 342, 344 of metal 336 by a distance 346 that is on the order of about a few nanometers or less. In another example, a portion 350 of the metal 336 that extends over the drain regions 310, 304 of the PJFET and NJFET also overlaps at least some of the gates 300, 312 of the PJFET and NJFET (FIGS. 34 and 35). Portion 350 nevertheless is distanced from portion 352 by a distance 356 that is on the order of about a few nanometers or less. It will be appreciated that these distances 346 and 356 are merely exemplary, though, since the minimum metal to metal spacing is dependent on applicable design rules. Additionally, portions 340, 350 may be referred to as field plates, and such field plates mitigate drift in electrical parameters that can be caused by field induced migration of charge and/or impurities in the semiconductor surface, for example. The field plates may, for example, be tied to the potential applied to the gates 300, 312 to mitigate depletion of the respective surface shields 258, 244 of the PJFET and the NJFET, for example. After the field plates are formed, the method 100 advances to 148 where further back end processing is performed, such as forming one or more conductive or insulative layers (not illustrated) over the transistors, for example.

Figure 36:
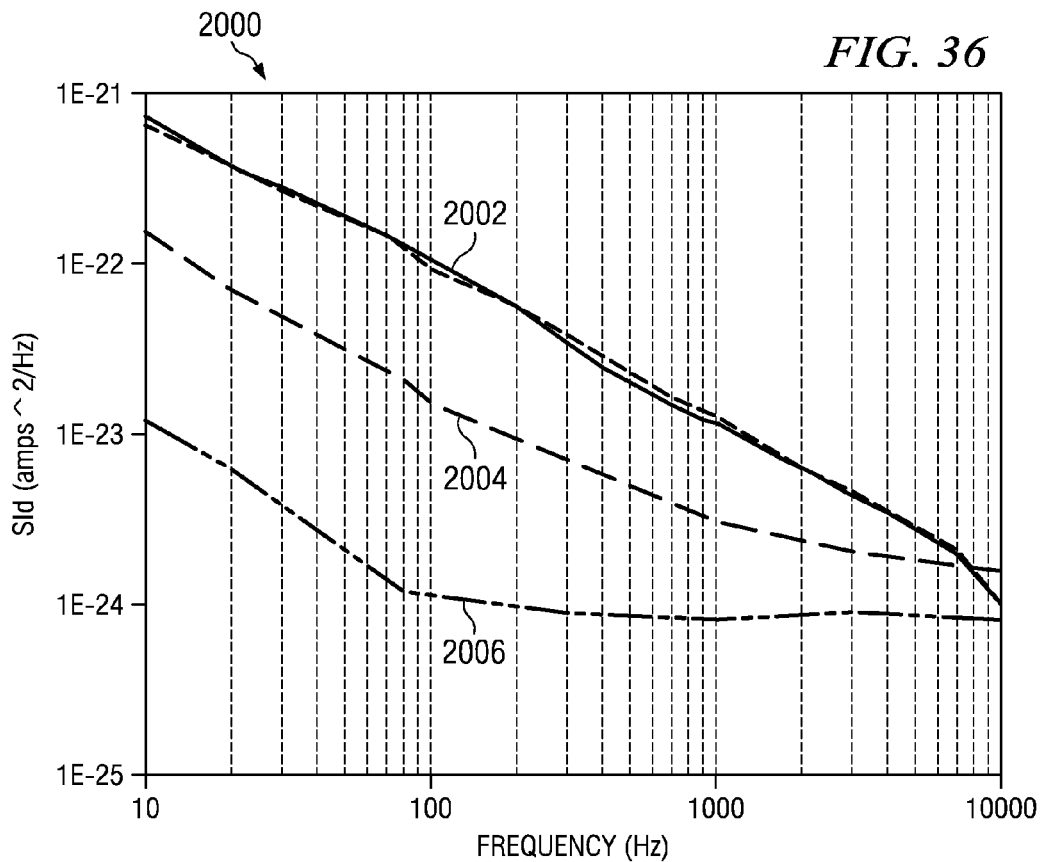
FIG. 36 is a graph illustrating noise reduction in a JFET when a silicide block is used in forming gate, source and drain regions.

It will be appreciated that the silicide block 292, surface shields 258, 244 and the field plates 340, 350 implemented herein substantially reduce noise while increasing device stability. Turning to FIG. 36, for example, a graph 2000 illustrates how noise is improved (or rather reduced) by an order of magnitude through fabrication as described herein. In the graph 2000, frequency, as measured in Hertz (Hz), is plotted logarithmically on the x axis, while a noise metric known as noise density (SId) is plotted on the y axis, where the SId is measured in amps squared per Hz. A first curve 2002 corresponds to noise in a JFET where STI is used to separate the gate, source and drain regions, while a second curve 2004 depicts noise in a JFET where SBLK is used to separate the gate, source and drain regions, and a third curve 2006 corresponds to noise in a JFET where SBLK and a surface shield are implemented in the JFET. With the silicide block alone, at around 100 Hz, it can be seen that noise is reduced to around 1E-23 down from around 1E-22 when STI is used. The noise is further reduced to around 1E-24 at around 100 Hz when the surface shield is implemented along with the SBLK. It will be appreciated that the noise (SId) begins to decrease abruptly as the frequency goes above 10000 Hz. This is due to limited high frequency response of the device(s) used to generate data for FIG. 20. Additionally, although not as dramatic, it will be appreciated that implementing field plates as described herein further reduces noise in the JFET by mitigating charge trapping that can occur in and around non uniform regions of the device.

Figure 37:
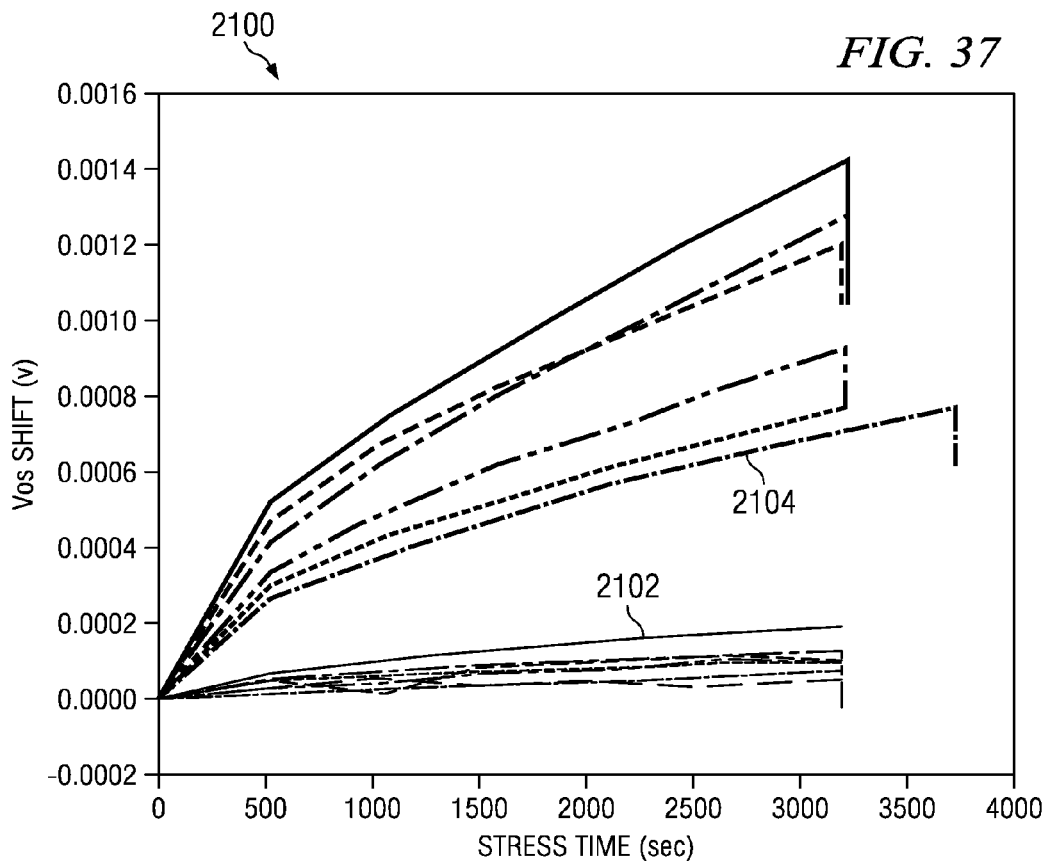
FIGS. 37 and 38 graphically illustrate improvements in device stability when a surface shield is implemented in the JFET.
Figure 38:
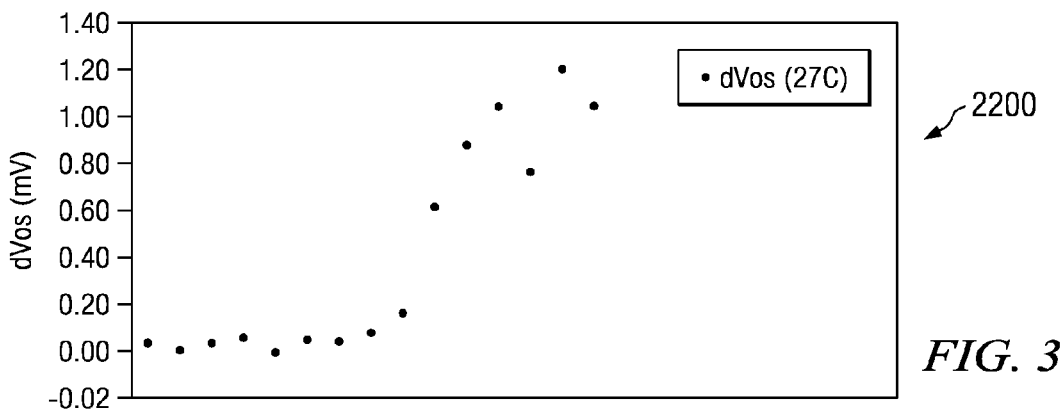

FIGS. 37 and 38 illustrate improvement in device stability when a surface shield is implemented in a JFET. In FIG. 37, for example, a graph 2100 includes multiple instances or samples of input offset voltages plotted over time. It will be appreciated that input offset voltage is a metric that is indicative of device stability, where less change in input offset voltage implies a more stable device. Accordingly, the group 2102 of plots toward the bottom of the graph 2100 corresponds to more stable devices, while the other group 2104 of plots corresponds to less stable devices. It will be appreciated that the plots in the lower group 2102 were derived from devices that included a surface shield, while the other plots 2104 were generated from devices that did not include a surface shield.

To generate the plots illustrated in FIG. 37, two like JFETS (e.g., two NJFETS or two PJFETS with a surface shield or two NJFETS or two PJFETS without a surface shield) were coupled together in a differential amplifier input configuration, where the respective sources of the devices were tied together and a differential voltage was applied across the gates of the devices to stress the devices. The devices were stressed for just under an hour (x axis) and the change in input offset voltage (dVos) was plotted on the y axis (in millivolts (mV)), where input offset voltage is the difference in the respective gate voltages of the JFETS being stressed/tested.

FIG. 38 is a graph 2200 that illustrates the change in input offset voltage (dVos) (y axis) for the respective samples/curves (x axis) from FIG. 37, where the end point of each plot in FIG. 37 is plotted as a single point in FIG. 38. It can be seen that nine samples were obtained from JFETS having surface shields and that six samples were obtained from JFETS not having surface shields. The samples derived from JFETS having surface shields are substantially more stable than those generated from JFETS that do not have surface shields since they experience a much lower change in input offset voltage. Generally speaking, the JFETS that have surface shields are approximately ten times more stable than the JFETS that lack surface shields. Accordingly, fashioning a JFET as described herein allows the device to be substantially more stable and produce substantially less noise while not requiring the size of the device to be increased.

Figure 39:
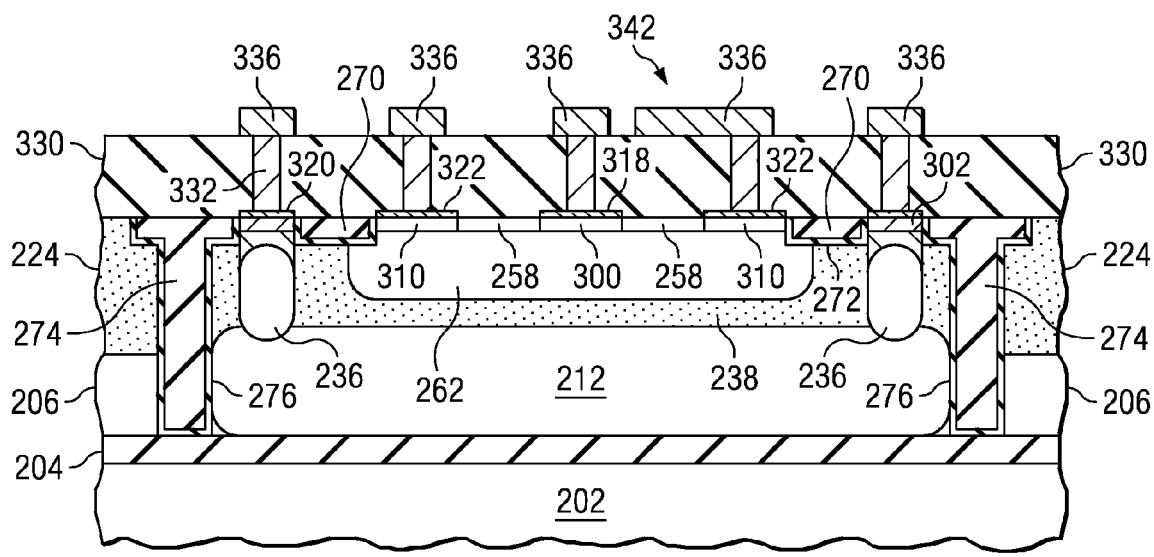
FIGS. 39 and 40 are cross-sectional illustrations of other exemplary JFETs comprising a single epitaxial layer.
Figure 40:
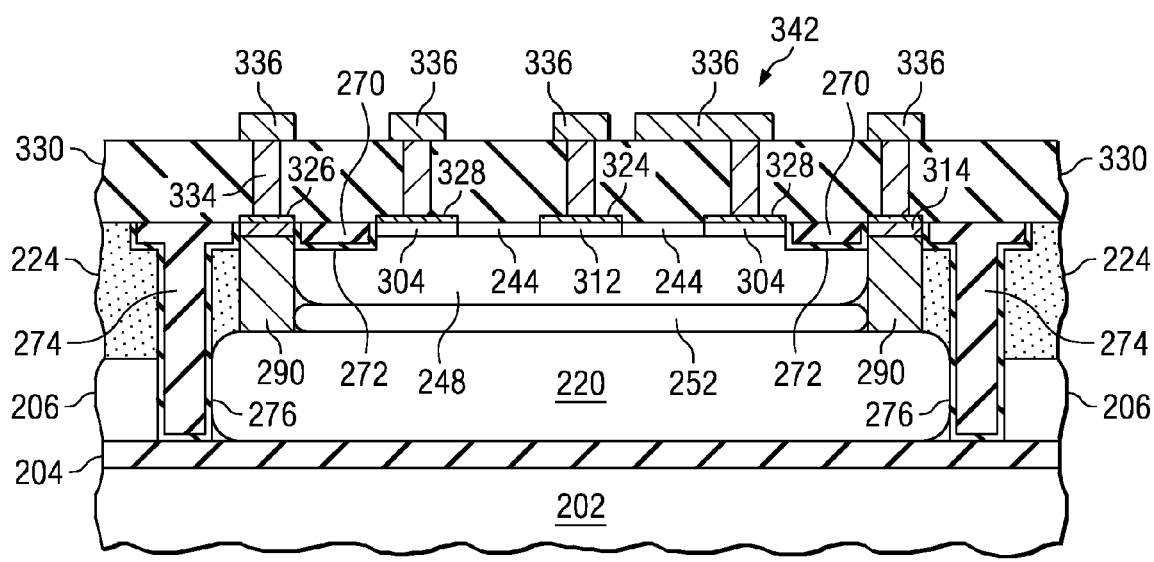

It will be appreciated that while first and second epitaxial layers NEPI1 224 and NEPI2 238 are disclosed herein, as well as first and second p buried layers PBL1 220 and PBL2 230, a JFET can also be formed with a single epitaxial layer and a single p buried layer. Turning to FIGS. 39 and 40, for example, an exemplary PJFET and NJFET are formed with a single epitaxial layer and a single p buried layer. More particularly, in the illustrated examples, the PJFET is formed with the first epitaxial layer NEPI1 224 and the NBL1 212 (FIG. 39), while the NJFET is formed with the first epitaxial layer NEPI1 224 and the PBL1 220 (FIG. 40). The device would be fashioned as described herein except that the second epitaxial layer NEPI2 238 would not be grown, the second p buried layer PBL2 230 would not be formed and the features previously formed in the second epitaxial layer NEPI2 238 would instead be formed in the first epitaxial layer NEPI1 224.

It will be appreciated that while reference is made throughout this document to exemplary structures in discussing aspects of one or more methodologies described herein (e.g., those structures presented in FIGS. 2-35 while discussing the methodology set forth in FIG. 1), those methodologies are not to be limited by the corresponding structures presented. Rather, the methodologies (and structures) are to be considered independent of one another and able to stand alone and be practiced without regard to any of the particular aspects depicted in the figures. Additionally, the structures and/or layers described herein can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions relative to one another for purposes of simplicity and ease of understanding, and that actual dimensions may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A method of forming a p type junction field effect transistor (PJFET) and an n type junction field effect transistor (NJFET) in a semiconductor substrate, comprising:
    forming a first n type buried layer (NBL1) in the substrate;
    forming a first p type buried layer (PBL1) in the substrate, but laterally spaced from the NBL1;
    forming a first n type epitaxial layer (NEPI1) over the substrate;
    forming a second p type buried layer (PBL2) over the PBL1 in the NEPI1;
    forming one or more DEEPNX regions over the NBL1 in the NEPI1;
    forming a second n type epitaxial layer (NEPI2) over the NEPI1;
    forming a p type surface shield near an upper surface of the NEPI2, where the p type surface shield resides over at least some of the PBL2;
    forming an n type channel of the NJFET in the NEPI2, where the n type channel resides over at least some of the PBL2;
    forming a p type bottom gate (BG) near a lower surface of the NEPI2, where the p type BG resides over at least some of the PBL2;
    forming an n type surface shield near an upper surface of the NEPI2, where the n type surface shield resides over at least some of the NBL1;
    forming a p type channel of the PJFET in the NEPI2, where the p type channel resides over at least some of the NBL1;
    forming one or more isolation areas that isolate the PJFET from the NJFET at least by being formed between the NBL1 and the PBL1;
    forming one or more n type back gate contact regions in the NEPI2 down to the one or more DEEPNX regions;
    forming one or more p type back gate contact regions in the NEPI2 down to the PBL2;
    forming a layer of silicide block material (SBLK) over the NEPI2;
    patterning the SBLK to expose areas of the NEPI2 where gate, source and drain regions are to be formed;
    forming an n type gate region in the p type channel of the PJFET, and n type source and drain regions in the n type channel of the NJFET;
    forming p type source and drain regions in the p type channel of the PJFET, and a p type gate region in the n type channel of the NJFET;
    siliciding the gate, source and drain regions in the p type channel of the PJFET and in the n type channel of the NJFET;
    forming a layer of dielectric material over the silicided gate, source and drain regions and over the NEPI2;
    forming conductive contacts extending down through the layer of dielectric material to the silicided gate, source and drain regions in the p type channel of the PJFET and in the n type channel of the NJFET; and
    forming a field plate over at least one of the conductive contacts extending down to one of the gate, source and drain regions of at least one of the PJFET and the NJFET, where the field plate also extends over at least some of at least one other of the gate, source and drain regions of the at least one of the PJFET and the NJFET.

2. The method of claim 1, wherein forming the field plate comprises forming a field plate over at least one of the conductive contacts extending down to the source and drain regions of the at least one of the PJFET and the NJFET, where the field plate also extends over at least some of the gate region of the at least one of the PJFET and the NJFET.

3. A method of forming a p type junction field effect transistor (PJFET) in a semiconductor substrate, comprising:
    forming a first n type buried layer (NBL1) in the substrate;
    forming a first n type epitaxial layer (NEPI1) over the substrate;
    forming one or more DEEPNX regions over the NBL1 in the NEPI1;
    forming a second n type epitaxial layer (NEPI2) over the NEPI1;
    forming an n type surface shield near an upper surface of the NEPI2, where the n type surface shield resides over at least some of the NBL1;
    forming a p type channel in the NEPI2, where the p type channel resides over at least some of the NBL1;
    forming one or more n type back gate contact regions in the NEPI2 down to the one or more DEEPNX regions;
    forming a layer of silicide block material (SBLK) over the NEPI2;
    patterning the SBLK to expose areas of the NEPI2 where gate, source and drain regions are to be formed;
    forming an n type gate region in the p type channel;
    forming p type source and drain regions in the p type channel;
    siliciding the gate, source and drain regions in the p type channel;
    forming a layer of dielectric material over the silicided gate, source and drain regions and over the NEPI2;
    forming conductive contacts extending down through the layer of dielectric material to the silicided gate, source and drain regions in the p type channel; and
    forming a field plate over at least one of the conductive contacts extending down to one of the gate, source and drain regions, where the field plate also extends over at least some of at least one other of the gate, source and drain regions.

4. The method of claim 3, wherein forming the field plate comprises forming a field plate over at least one of the conductive contacts extending down to the source and drain regions, where the field plate also extends over at least some of the gate region.

5. A method of forming an n type junction field effect transistor (NJFET) in a semiconductor substrate, comprising:
    forming a first p type buried layer (PBL1) in the substrate;
    forming a first n type epitaxial layer (NEPI1) over the substrate;
    forming a second p type buried layer (PBL2) over the PBL1 in the NEPI1;
    forming a second n type epitaxial layer (NEPI2) over the NEPI1;
    forming a p type surface shield near an upper surface of the NEPI2, where the p type surface shield resides over at least some of the PBL2;
    forming an n type channel in the NEPI2, where the n type channel resides over at least some of the PBL2;
    forming a p type bottom gate (BG) near a lower surface of the NEPI2, where the p type BG resides over at least some of the PBL2;

forming one or more p type back gate contact regions in the NEPI2 down to the PBL2;

forming a layer of silicide block material (SBLK) over the NEPI2;

patterning the SBLK to expose areas of the NEPI2 where gate, source and drain regions are to be formed;

forming n type source and drain regions in the n type channel;

forming a p type gate region in the n type channel;

siliciding the gate, source and drain regions in the n type channel;

forming a layer of dielectric material over the silicided gate, source and drain regions and over the NEPI2;

forming conductive contacts extending down through the layer of dielectric material to the silicided gate, source and drain regions in the n type channel; and forming a field plate over at least one of the conductive contacts extending down to one of the gate, source and drain regions, where the field plate also extends over at least some of at least one other of the gate, source and drain regions.

6. The method of claim 5, wherein forming the field plate comprises forming a field plate over at least one of the conductive contacts extending down to the source and drain regions, where the field plate also extends over at least some of the gate region.

7. A p type junction field effect transistor (PJFET) in a semiconductor substrate, comprising:
a first n type buried layer (NBL1) in the substrate;
a first n type epitaxial layer (NEPI1) over the substrate;
one or more DEEPNX regions over the NBL1 in the NEPI1;
a second n type epitaxial layer (NEPI2) over the NEPI1;
an n type surface shield near an upper surface of the NEPI2, where the n type surface shield resides over at least some of the NBL1;
a p type channel in the NEPI2, where the p type channel resides over at least some of the NBL1;
one or more n type back gate contact regions in the NEPI2 extending down to the one or more DEEPNX regions;
a silicided n type gate region in the p type channel;
silicided p type source and drain regions in the p type channel;
a layer of dielectric material over the silicided gate, source and drain regions and over the NEPI2;
conductive contacts extending down through the layer of dielectric material to the silicided gate, source and drain regions; and
a field plate over at least one of the conductive contacts extending down to one of the gate, source and drain regions, where the field plate also extends over at least some of at least one other of the gate, source and drain regions.

8. The PJFET of claim 7, wherein the field plate is a field plate formed over at least one of the conductive contacts extending down to the source and drain regions and also extends over at least some of the gate region.

9. An n type junction field effect transistor (NJFET) in a semiconductor substrate, comprising:
a first p type buried layer (PBL1) in the substrate;
a first n type epitaxial layer (NEPI1) over the substrate;
a second p type buried layer (PBL2) over the PBL1 in the NEPI1;
a second n type epitaxial layer (NEPI2) over the NEPI1;
a p type surface shield near an upper surface of the NEPI2, where the p type surface shield resides over at least some of the PBL2;
an n type channel in the NEPI2, where the n type channel resides over at least some of the PBL2;
a p type bottom gate (BG) near a lower surface of the NEPI2, where the p type BG resides over at least some of the PBL2;
one or more p type back gate contact regions in the NEPI2 extending down to the PBL2;
silicided n type source and drain regions in the n type channel;
a silicided p type gate region in the n type channel;
a layer of dielectric material over the silicided gate, source and drain regions and over the NEPI2;
conductive contacts extending down through the layer of dielectric material to the silicided gate, source and drain regions; and
a field plate over at least one of the conductive contacts extending down to one of the gate, source and drain regions, where the field plate also extends over at least some of at least one other of the gate, source and drain regions.

10. The NJFET of claim 9, wherein the field plate is a field plate formed over at least one of the conductive contacts extending down to the source and drain regions and also extends over at least some of the gate region.

11. A method of forming a junction field effect transistor (JFET) on a semiconductor substrate, comprising:
forming a layer of silicide block material over at least some of the substrate including over areas where source, drain and gate regions are to be formed in the substrate;
patterning the layer of silicide block material to expose areas of the substrate where the source, drain and gate regions are to be formed;
performing one or more doping operations to form a surface shield below a surface of the substrate including in areas where the source, drain and gate regions are formed in the substrate, and
performing one or more doping operations to form the source, drain and gate regions in the exposed areas of the substrate, where the source, drain and gate regions are self aligned with the patterned silicide block;
wherein the surface shield can be formed before or after the source, drain and gate regions are formed; and
wherein at least one of:
the source, gate and drain regions extend deeper into the substrate than the surface shield, and
the surface shield has dopant concentration that is less than the concentration of dopants in the source and drain regions.

12. The method of claim 11, wherein forming the layer of silicide block material comprises:
forming a layer of oxide based material over at least some of the substrate including over areas where the source, drain and gate regions are to be formed in the substrate, and
forming a layer of nitride based material over the layer of oxide based material.

13. The method of claim 11, further comprising forming a field plate over an electrically conductive gate contact, where the field plate also extends over at least some of at least one of the source region and the drain region.

14. The method of claim 11, further comprising forming a field plate over an electrically conductive drain contact, where the field plate also extends over at least some of the gate region.

15. A method of forming a p type junction field effect transistor (PJFET) and an n type junction field effect transistor (NJFET) in a semiconductor substrate, comprising:

forming a first n type buried layer (NBL1) in the substrate;
forming a first p type buried layer (PBL1) in the substrate, but laterally spaced from the NBL1;
forming a first n type epitaxial layer (NEPI1) over the substrate;
forming one or more DEEPNX regions over the NBL1 in the NEPI1;
forming a p type surface shield near an upper surface of the NEPI1, where the p type surface shield resides over at least some of the PBL1;
forming an n type channel of the NJFET in the NEPI1, where the n type channel resides over at least some of the PBL1;
forming a p type bottom gate (BG) near a lower surface of the NEPI1, where the p type BG resides over at least some of the PBL1;
forming an n type surface shield near an upper surface of the NEPI1, where the n type surface shield resides over at least some of the NBL1;
forming a p type channel of the PJFET in the NEPI1, where the p type channel resides over at least some of the NBL1;
forming one or more isolation areas that isolate the PJFET from the NJFET at least by being formed between the NBL1 and the PBL1;
forming one or more n type back gate contact regions in the NEPI1 down to the one or more DEEPNX regions;
forming one or more p type back gate contact regions in the NEPI1 down to the PBL1;
forming a layer of silicide block material (SBLK) over the NEPI1;
patterning the SBLK to expose areas of the NEPI1 where gate, source and drain regions are to be formed;
forming an n type gate region in the p type channel of the PJFET, and n type source and drain regions in the n type channel of the NJFET;
forming p type source and drain regions in the p type channel of the PJFET, and a p type gate region in the n type channel of the NJFET;
siliciding the gate, source and drain regions in the p type channel of the PJFET and in the n type channel of the NJFET;
forming a layer of dielectric material over the silicided gate, source and drain regions and over the NEPI1;
forming conductive contacts extending down through the layer of dielectric material to the silicided gate, source and drain regions in the p type channel of the PJFET and in the n type channel of the NJFET; and
forming a field plate over at least one of the conductive contacts extending down to one of the gate, source and drain regions of at least one of the PJFET and the NJFET, where the field plate also extends over at least some of at least one other of the gate, source and drain regions of the PJFET and the NJFET.

16. A method of forming a p type junction field effect transistor (PJFET) in a semiconductor substrate, comprising:
forming a first n type buried layer (NBL1) in the substrate;
forming a first n type epitaxial layer (NEPI1) over the substrate;
forming one or more DEEPNX regions over the NBL1 in the NEPI1;
forming an n type surface shield near an upper surface of the NEPI1, where the n type surface shield resides over at least some of the NBL1;
forming a p type channel in the NEPI1, where the p type channel resides over at least some of the NBL1;

forming one or more n type back gate contact regions in the NEPI1 down to the one or more DEEPNX regions;
forming a layer of silicide block material (SBLK) over the NEPI1;
patterning the SBLK to expose areas of the NEPI2 where gate, source and drain regions are to be formed;
forming an n type gate region in the p type channel;
forming p type source and drain regions in the p type channel;
siliciding the gate, source and drain regions in the p type channel;
forming a layer of dielectric material over the silicided gate, source and drain regions and over the NEPI1;
forming conductive contacts extending down through the layer of dielectric material to the silicided gate, source and drain regions in the p type channel; and
forming a field plate over at least one of the conductive contacts extending down to one of the gate, source and drain regions, where the field plate also extends over at least some of at least one other of the gate, source and drain regions.

17. A method of forming an n type junction field effect transistor (NJFET) in a semiconductor substrate, comprising:
forming a first p type buried layer (PBL1) in the substrate;
forming a first n type epitaxial layer (NEPI1) over the substrate;
forming a p type surface shield near an upper surface of the NEPI1, where the p type surface shield resides over at least some of the PBL1;
forming an n type channel in the NEPI1, where the n type channel resides over at least some of the PBL1;
forming a p type bottom gate (BG) near a lower surface of the NEPI1, where the p type BG resides over at least some of the PBL1;
forming one or more p type back gate contact regions in the NEPI1 down to the PBL1;
forming a layer of silicide block material (SBLK) over the NEPI1;
patterning the SBLK to expose areas of the NEPI2 where gate, source and drain regions are to be formed;
forming n type source and drain regions in the n type channel;
forming a p type gate region in the n type channel;
siliciding the gate, source and drain regions in the n type channel;
forming a layer of dielectric material over the silicided gate, source and drain regions and over the NEPI1;
forming conductive contacts extending down through the layer of dielectric material to the silicided gate, source and drain regions in the n type channel; and
forming a field plate over at least one of the conductive contacts extending down to one of the gate, source and drain regions, where the field plate also extends over at least some of at least one other of the gate, source and drain regions.

18. A p type junction field effect transistor (PJFET) in a semiconductor substrate, comprising:
a first n type buried layer (NBL1) in the substrate;
a first n type epitaxial layer (NEPI1) over the substrate;
one or more DEEPNX regions over the NBL1 in the NEPI1;
an n type surface shield near an upper surface of the NEPI1, where the n type surface shield resides over at least some of the NBL1;
a p type channel in the NEPI1, where the p type channel resides over at least some of the NBL1;

one or more n type back gate contact regions in the NEPI1 extending down to the one or more DEEPNX regions;
a silicided n type gate region in the p type channel;
silicided p type source and drain regions in the p type channel;
a layer of dielectric material over the silicided gate, source and drain regions and over the NEPI1;
conductive contacts extending down through the layer of dielectric material to the silicided gate, source and drain regions; and
a field plate over at least one of the conductive contacts extending down to one of the gate, source and drain regions, where the field plate also extends over at least some of at least one other of the gate, source and drain regions.

19. An n type junction field effect transistor (NJFET) in a semiconductor substrate, comprising:
a first p type buried layer (PBL1) in the substrate;
a first n type epitaxial layer (NEPI1) over the substrate;
a p type surface shield near an upper surface of the NEPI1, where the p type surface shield resides over at least some of the PBL1;
an n type channel in the NEPI1, where the n type channel resides over at least some of the PBL1;
a p type bottom gate (BG) near a lower surface of the NEPI1, where the p type BG resides over at least some of the PBL1;
one or more p type back gate contact regions in the NEPI1 extending down to the PBL1;
silicided n type source and drain regions in the n type channel;
a silicided p type gate region in the n type channel;
a layer of dielectric material over the silicided gate, source and drain regions and over the NEPI1;
conductive contacts extending down through the layer of dielectric material to the silicided gate, source and drain regions; and
a field plate over at least one of the conductive contacts extending down to one of the gate, source and regions, where the field plate also extends over at least some of at least one other of the gate, source and drain regions.

20. The method of claim 2, wherein forming the field plate comprises forming a field plate over at least one of the conductive contacts extending down to the source and drain regions of each of the PJFET and the NJFET, where the field plate also extends over at least some of the gate region of the same PJFET and NJFET.

21. The method of claim 1, wherein forming the field plate comprises forming a field plate over the conductive contact extending down to the gate region of each of the PJFET and the NJFET, where the field plate also extends over at least some of at least one of the source and drain regions of the same PJFET and NJFET.

22. The method of claim 21, wherein forming the field plate comprises forming a field plate over the conductive contact extending down to the gate region of each of the PJFET and the NJFET, where the field plate also extends over at least some of both of the source and drain regions of the same PJFET and NJFET.

23. The method of claim 3, wherein forming the field plate comprises forming a field plate over the conductive contact extending down to the gate region, where the field plate also extends over at least some of at least one of the source and drain regions.

24. The method of claim 23, wherein the field plate formed over the conductive contact extending down to the gate region also extends over at least some of both of the source and drain regions.

25. The method of claim 5, wherein forming the field plate comprises forming a field plate over the conductive contact extending down to the gate region, where the field plate also extends over at least some of at least one of the source and drain regions.

26. The method of claim 25, wherein the field plate formed over the conductive contact extending down to the gate region also extends over at least some of both of the source and drain regions.

27. The PJFET of claim 7, wherein the field plate is a field plate formed over the conductive contact extending down to the gate region and also extends over at least some of at least one of the source and drain regions.

28. The PJFET of claim 27, wherein the field plate formed over the conductive contact extending down to the gate region also extends over at least some of both of the source and drain regions.

29. The NJFET of claim 9, wherein the field plate is a field plate formed over the conductive contact extending down to the gate region and also extends over at least some of at least one of the source and drain regions.

30. The PJFET of claim 29, wherein the field plate formed over the conductive contact extending down to the gate region also extends over at least some of both of the source and drain regions.

31. The method of claim 15, wherein forming the field plate comprises forming a field plate over at least one of the conductive contacts extending down to the source and drain regions of at least one of the PJFET and the NJFET, where the field plate also extends over at least some of the gate region of the at least one of the PJFET and the NJFET.

32. The method of claim 31, wherein forming the field plate comprises forming a field plate over at least one of the conductive contacts extending down to the source and drain regions of each of the PJFET and the NJFET, where the field plate also extends over at least some of the gate region of each of the same PJFET and NJFET.

33. The method of claim 15, wherein forming the field plate comprises forming a field plate over the conductive contact extending down to the gate region of each of the PJFET and the NJFET, where the field plate also extends over at least some of at least one of the source and drain regions of each of the same PJFET and NJFET.

34. The method of claim 33, wherein forming the field plate comprises forming a field plate over the conductive contact extending down to the gate region of each of the PJFET and the NJFET, where the field plate also extends over at least some of both of the source and drain regions of each of the same PJFET and NJFET.

* * * * *